US011557341B2

(12) United States Patent
Xu et al.

(10) Patent No.: US 11,557,341 B2
(45) Date of Patent: Jan. 17, 2023

(54) MEMORY ARRAY STRUCTURES AND METHODS FOR DETERMINATION OF RESISTIVE CHARACTERISTICS OF ACCESS LINES

(71) Applicant: MICRON TECHNOLOGY, INC., Boise, ID (US)

(72) Inventors: Dan Xu, Sunnyvale, CA (US); Jun Xu, Shanghai (CN); Erwin E. Yu, San Jose, CA (US); Paolo Tessariol, Arcore (IT); Tomoko Ogura Iwasaki, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/011,018

(22) Filed: Sep. 3, 2020

(65) Prior Publication Data
US 2021/0201993 A1     Jul. 1, 2021

Related U.S. Application Data

(60) Provisional application No. 62/954,057, filed on Dec. 27, 2019.

(51) Int. Cl.
*G11C 13/00*     (2006.01)

(52) U.S. Cl.
CPC ........ *G11C 13/003* (2013.01); *G11C 13/0038* (2013.01)

(58) Field of Classification Search
CPC . G11C 13/003; G11C 13/0038; G11C 29/025; G11C 8/14; G11C 5/025; G11C 5/063; G11C 5/066; G11C 16/0483; G11C 16/08; G11C 29/028; G11C 29/24; G11C 29/54; G11C 2029/1202; G11C 2029/4402
See application file for complete search history.

(56) References Cited

U.S. PATENT DOCUMENTS 8,559,235 B2 * 10/2013 Yoon .................. G11C 16/3445
365/185.29
9,620,217 B2 *  4/2017 Lue ................... H01L 27/11551
(Continued)

OTHER PUBLICATIONS

International Search Report and Written Opinion of the International Searching Authority for Application No. PCT/US2020/070869 dated Mar. 24, 2021 (13 pages).

*Primary Examiner* — Khamdan N. Alrobaie
(74) *Attorney, Agent, or Firm* — Dicke, Billig & Czaja, PLLC

(57) ABSTRACT

Memory array structures providing for determination of resistive characteristics of access lines might include a first block of memory cells, a second block of memory cells, a first current path between a particular access line of the first block of memory cells and a particular access line of the second block of memory cells, and, optionally, a second current path between the particular access line of the second block of memory cells and a different access line of the first block of memory cells. Methods for determining resistive characteristics of access lines might include connecting the particular access line of the first block of memory cells to a driver, and determining the resistive characteristics in response to a current level through that access line and a voltage level of that access line.

36 Claims, 17 Drawing Sheets

(56) References Cited

U.S. PATENT DOCUMENTS

| | | | |
|---|---|---|---|
| 2010/0034020 A1* | 2/2010 | Tanaka | G11C 16/24 365/185.03 |
| 2015/0003157 A1* | 1/2015 | Aritome | G11C 16/3404 365/185.11 |
| 2016/0035423 A1* | 2/2016 | Nam | G11C 8/08 365/185.11 |
| 2018/0040377 A1* | 2/2018 | Sakui | G11C 8/14 |
| 2019/0066798 A1* | 2/2019 | Xu | G11C 11/5671 |
| 2019/0371812 A1* | 12/2019 | Oike | H01L 29/4234 |
| 2019/0371813 A1* | 12/2019 | Oike | H01L 23/5226 |
| 2021/0057020 A1* | 2/2021 | Tanaka | G11C 11/5642 |
| 2021/0199703 A1* | 7/2021 | Xu | G01R 27/08 |
| 2021/0201993 A1* | 7/2021 | Xu | G11C 8/14 |
| 2021/0202009 A1* | 7/2021 | Kavalipurapu | G11C 16/3427 |

* cited by examiner

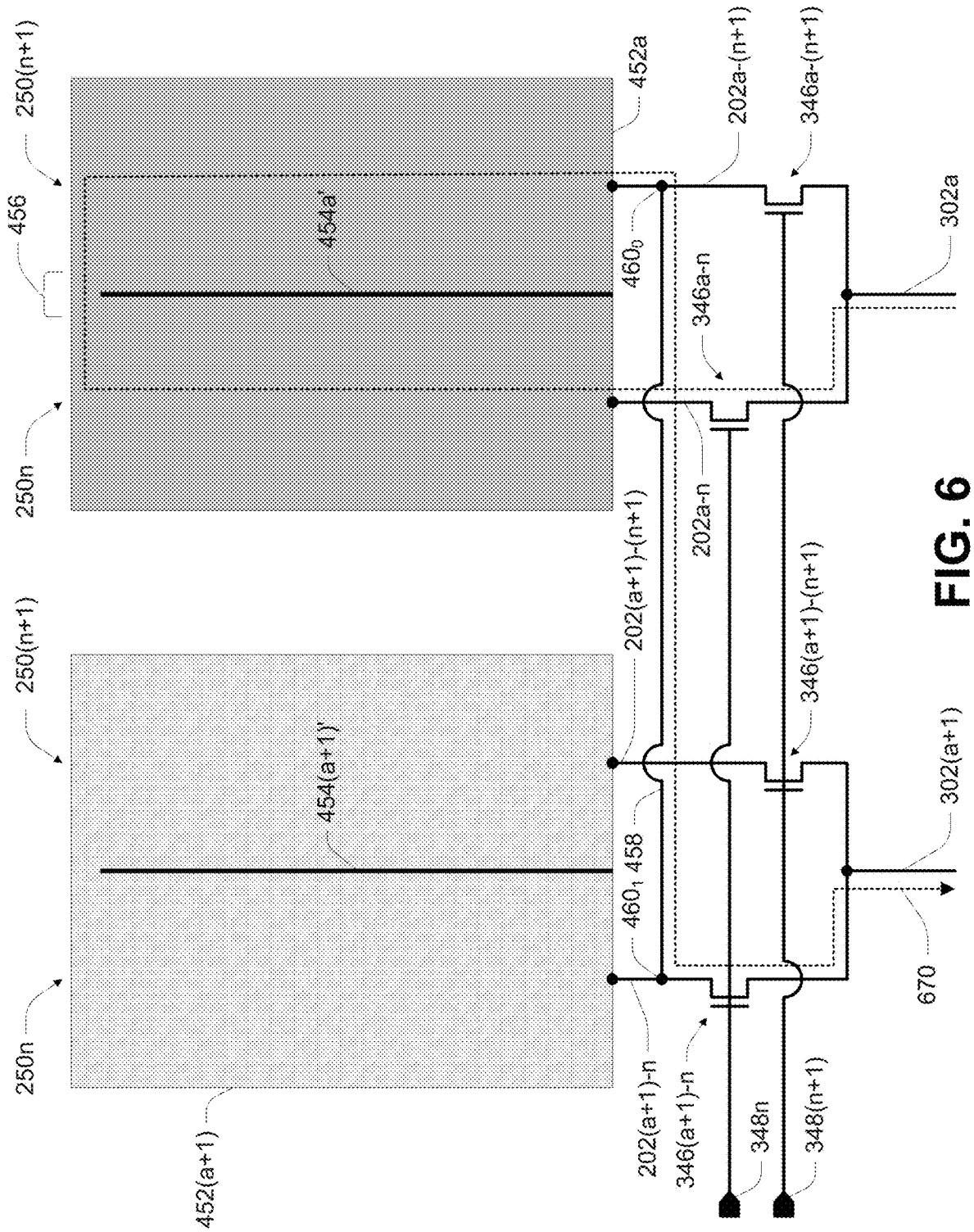

MEMORY ARRAY STRUCTURES AND METHODS FOR DETERMINATION OF RESISTIVE CHARACTERISTICS OF ACCESS LINES

RELATED APPLICATION

This application claims the benefit of U.S. Provisional Application No. 62/954,057, filed on Dec. 27, 2019, hereby incorporated herein in its entirety by reference.

TECHNICAL FIELD

The present disclosure relates generally to integrated circuits, and, in particular, in one or more embodiments, the present disclosure relates to memory array structures and methods for determination of resistive characteristics of access lines.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

Due to variabilities generally inherent in the fabrication of memory, physical attributes of various circuit components often vary among different memories, or among different portions of a single memory. As a result, different operational parameters, e.g., voltage levels or timing characteristics, might be used for different memories, or different portions of a single memory, to yield similar operational results. Determination of these operational parameters might involve performing testing on a memory including a variety of access operations using an initial set of operational parameters to establish a baseline operating characteristic, and adjusting the operational parameters in response to results of the testing until desired operating characteristic is obtained.

BRIEF DESCRIPTION OF THE DRAWINGS

FIG. 6 is a schematic of the array structure of FIG. 4B showing a current path for testing in accordance with an embodiment.

DETAILED DESCRIPTION

Figure 1:
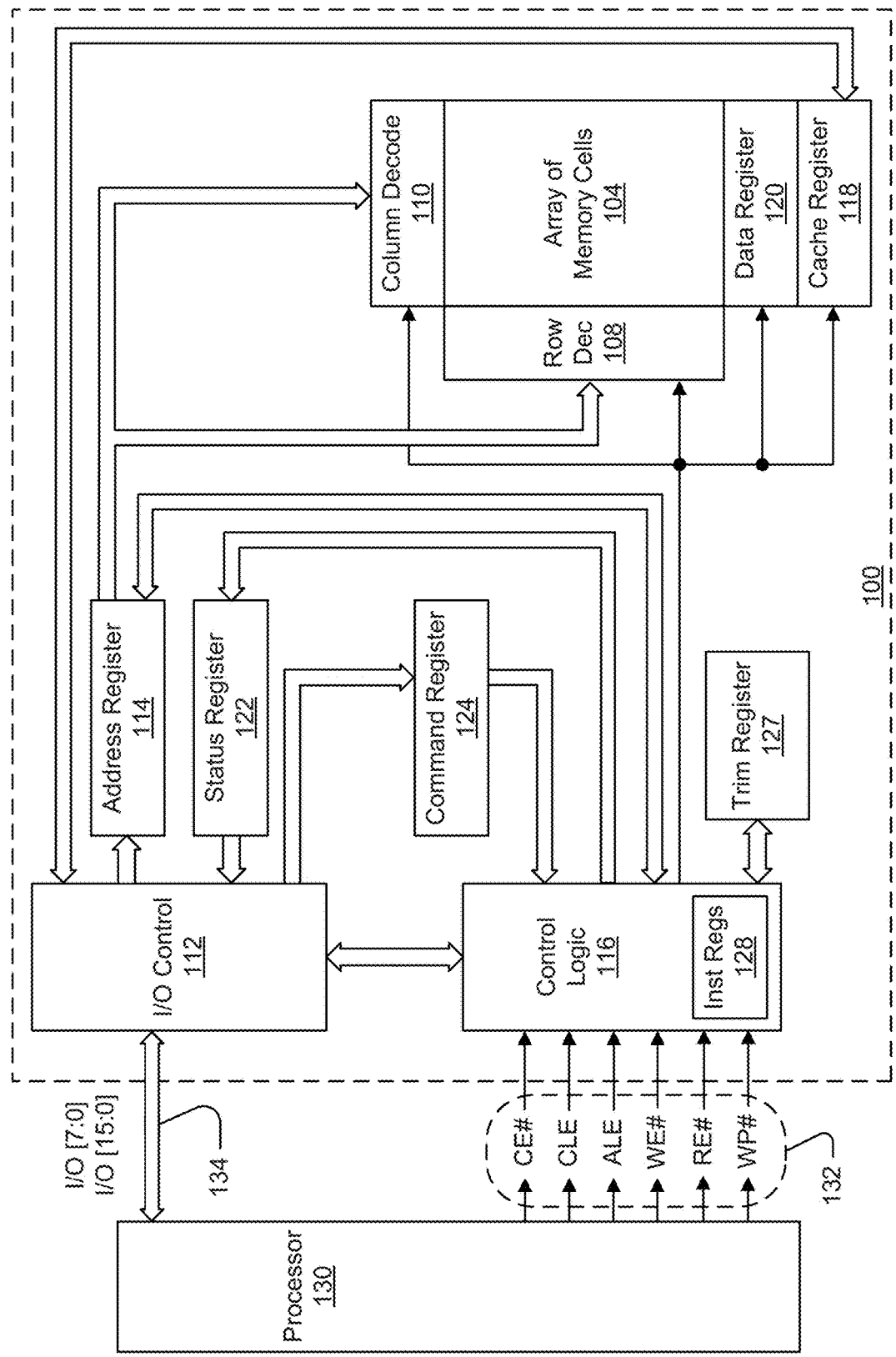
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOT) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register 127 may be in communication with the control logic 116. The trim register 127 might represent a volatile memory, latches or other storage location, volatile or non-volatile. For some embodiments, the trim register 127 might represent a portion of the array of memory cells 104. The trim register 127 might store information relating to the determination of resistance values of access lines, in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
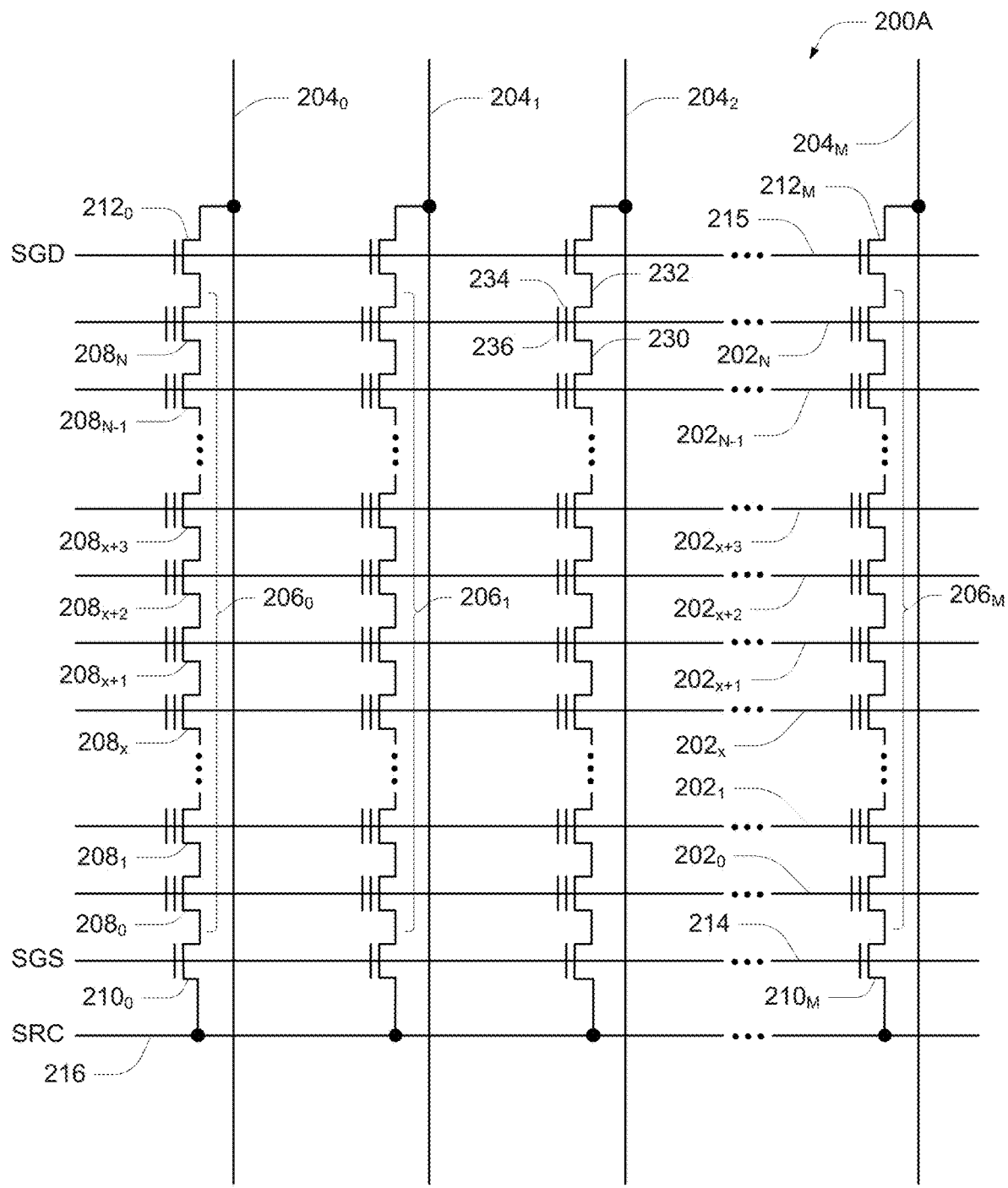
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) might be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) might be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A might be numbered consecutively from bit line $204_0$ to bit line $204_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
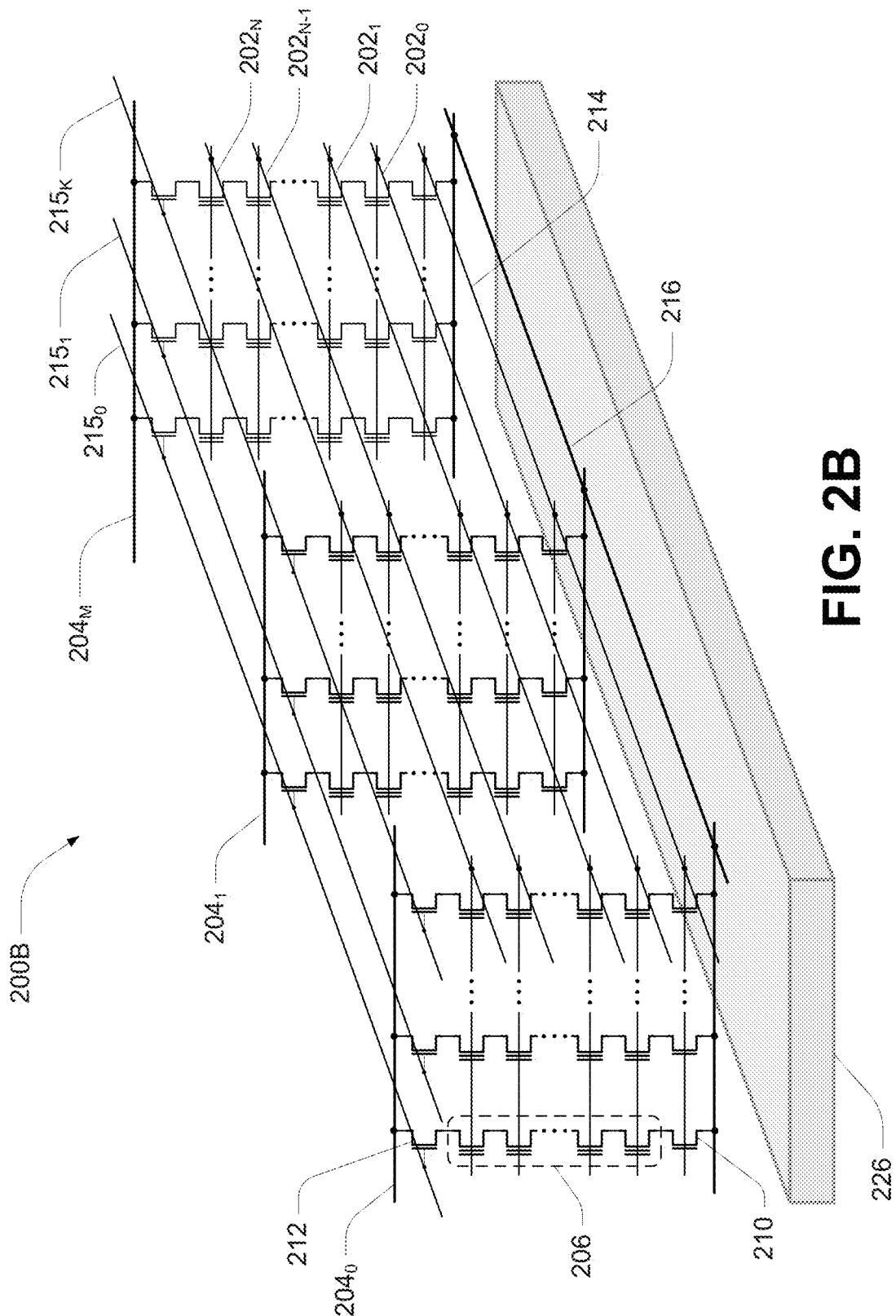

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a bit line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 might be connected to multiple rows of memory cells of the memory array 200B. Rows of memory cells that are commonly connected to each other by a particular word line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
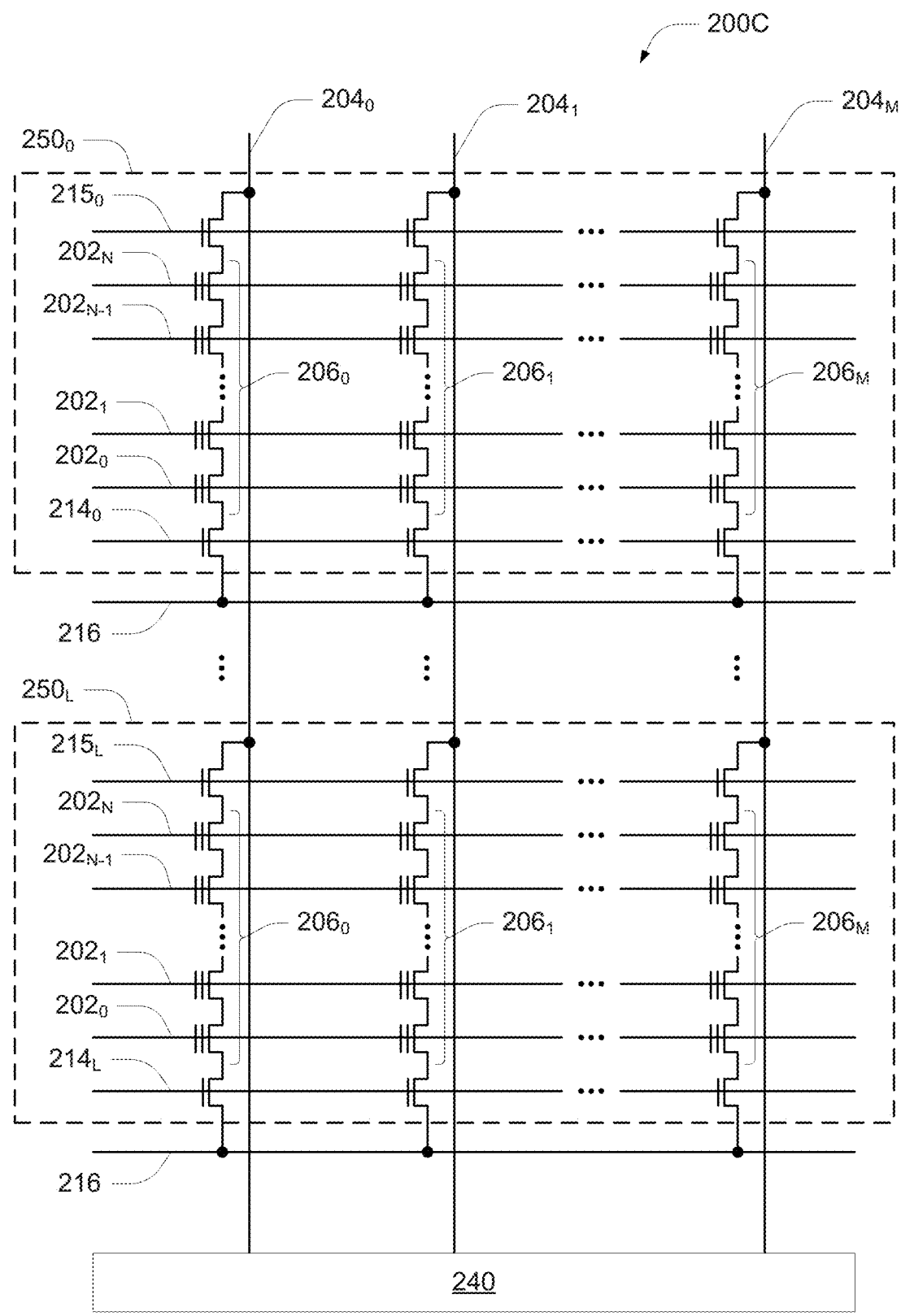

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells $250_0$-$250_L$. Blocks of memory cells 250 might be groupings of memory cells 208 that might be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 might have no direct connection to access lines 202 and select lines 214 and 215, respectively, of any other block of memory cells of the blocks of memory cells $250_0$-$250_L$.

The data lines $204_0$-$204_M$ might be connected (e.g., selectively connected) to a buffer portion 240, which might be a portion of a data buffer of the memory. The buffer portion 240 might correspond to a memory plane (e.g., the set of blocks of memory cells $250_0$-$250_0$. The buffer portion 240 might include sense circuits (not shown in FIG. 2C) for sensing data values indicated on respective data lines 204.

Figure 3:
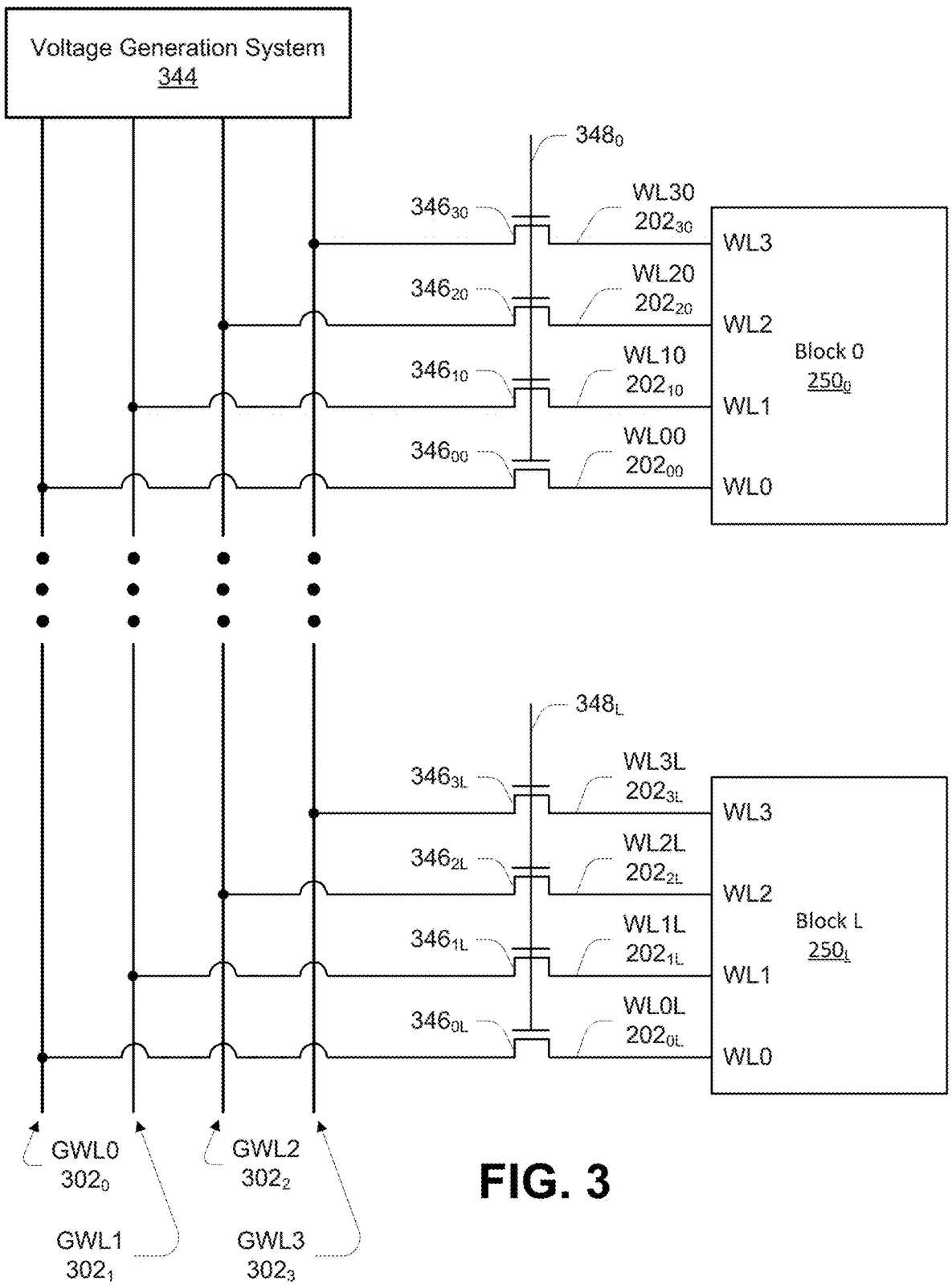
FIG. 3 is a block schematic of a portion of an array of memory cells and string drivers as could be used in a memory device of the type described with reference to FIG. 1.

FIG. 3 is a schematic of a portion of an array of memory cells and string drivers as could be used in a memory device of the type described with reference to FIG. 1 and depicting a many-to-one relationship between local access lines (e.g., local word lines) 202 and global access lines (e.g., global word lines) 302.

As depicted in FIG. 3, a plurality of blocks of memory cells 250 might have their local access lines (e.g., local word lines) 202 commonly selectively connected to a plurality of global access lines (e.g., global word lines) 302. For simplicity, drain select lines and source select lines, and their corresponding transistors, are not depicted. Although FIG. 3 depicts only blocks of memory cells $250_0$ and $250_L$ (Block 0 and Block L), additional blocks of memory cells 250 might have their local access lines 202 commonly connected to global access lines 302 in a like manner. Similarly, although FIG. 3 depicts only four local access lines 202, blocks of memory cells 250 might include fewer or more local access lines 202. The blocks of memory cells $250_0$-$250_L$ might belong to a single plane of memory cells.

To facilitate memory access operations to specific blocks of memory cells 250 commonly coupled to a given set of global access lines 302, each block of memory cells 250 might have a corresponding set of block select transistors 346 in a one-to-one relationship with their local access lines 202. Control gates of the set of block select transistors 346 for a given block of memory cells 250 might have their control gates commonly connected to a corresponding block select line 348. For example, for block of memory cells $250_0$, local access line $202_{00}$ might be selectively connected to global access line $302_0$ through block select transistor $346_{00}$, local access line $202_{10}$ might be selectively connected to global access line $302_1$ through block select transistor $346_{10}$, local access line $202_{20}$ might be selectively connected to global access line $302_2$ through block select transistor $346_{20}$, and local access line $202_{30}$ might be selectively connected to global access line $302_3$ through block select transistor $346_{30}$, while block select transistors $346_{00}$-$346_{30}$ are responsive to a control signal received on block select line $348_0$. The block select transistors 346 for a block of memory cells 250 might collectively be referred to as a string driver, or simply driver circuitry. Such driver circuitry might be formed in the peripheral circuitry 226, for example. Each block select transistor 346 might represent a selective connection of a local access line to its respective global access line. A voltage generation system 344 might be connected (e.g., selectively connected) to each global access line 302 to apply respective voltage levels to each global access line 302 for performing access operations.

Figure 4A:
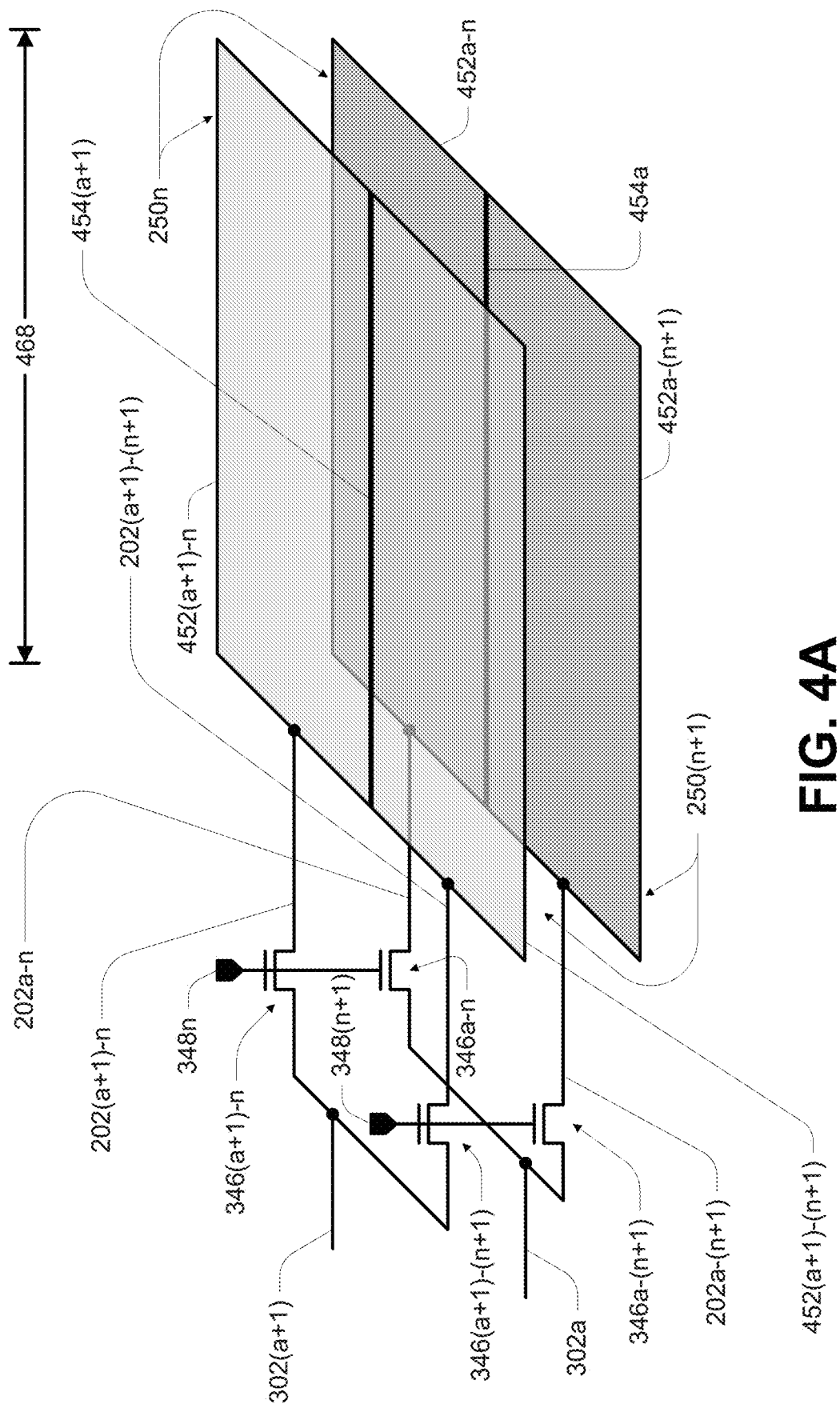
FIG. 4A is a conceptual perspective view of a memory array structure of the related art.

FIG. 4A is a conceptual perspective view of a memory array structure of the related art. As noted with regard to FIG. 2B, memory array structures might have tiers where multiple rows of memory cells have their access lines commonly connected. This might take the form of a number of conductive plates. FIG. 4A depicts how such conductive plates might be connected to global access lines.

FIG. 4A depicts two tiers of two different blocks of memory cell, e.g., two tiers corresponding to two respective global access lines, e.g., global access line 302a and global access line 302(a+1), for each of two different blocks of memory cells, e.g., block of memory cells 250n and 250(n+1). The block of memory cells 250n of FIG. 4A might correspond to the block of memory cells $250_0$ of FIG. 3, while the block of memory cells 250(n+1) of FIG. 4A might correspond to the block of memory cells $250_L$ of FIG. 3, for example. Similarly, the global access line 302(a+1) of FIG. 4A might correspond to the global access line $302_3$ of FIG. 3, while the global access line 302a of FIG. 4A might correspond to the global access line $302_2$ of FIG. 3, for example.

The global access line 302a might be selectively connected to a local access line 202a-n for the block of memory cells 250n through a block select transistor 346a-n, and might be selectively connected to a local access line 202a-(n+1) for the block of memory cells 250(n+1) through a block select transistor 346a-(n+1). The global access line 302(a+1) might be selectively connected to a local access line 202(a+1)-n for the block of memory cells 250n through a block select transistor 346(a+1)-n, and might be selectively connected to a local access line 202(a+1)-(n+1) for the block of memory cells 250(n+1) through a block select transistor 346(a+1)-(n+1). The block select transistors 346a-n and 346(a+1)-n might have their control gates connected to a block select line 348n. The block select transistors 346a-(n+1) and 346(a+1)-(n+1) might have their control gates connected to a block select line 348(n+1).

The local access line 202a-n might be connected to a conductive plate 452a-n, which might form a portion of the local access line 202a-n. The local access line 202(a+1)-n might be connected to a conductive plate 452(a+1)-n, which might form a portion of the local access line 202(a+1)-n. The local access line 202a-(n+1) might be connected to a conductive plate 452a-(n+1), which might form a portion of the local access line 202a-(n+1). The local access line 202(a+1)-(n+1) might be connected to a conductive plate 452(a+1)-(n+1), which might form a portion of the local access line 202(a+1)-(n+1). The conductive plates 452a-n and 452a-(n+1) might be fabricated as a contiguous conductive plate, and then isolated from each other by removing a portion of the contiguous conductive plate along its length 468, and filling a resulting void with a dielectric material to form the isolation region 454a. The isolation region 454a might be formed of a dielectric material, for example. The conductive plates 452(a+1)-n and 452(a+1)-(n+1) might be fabricated as a contiguous conductive plate, and then isolated from each other by removing a portion of the contiguous conductive plate, and filling a resulting void with a dielectric material to form the isolation region 454(a+1). The isolation region 454(a+1) might be formed of a dielectric, for example.

Figure 4B:
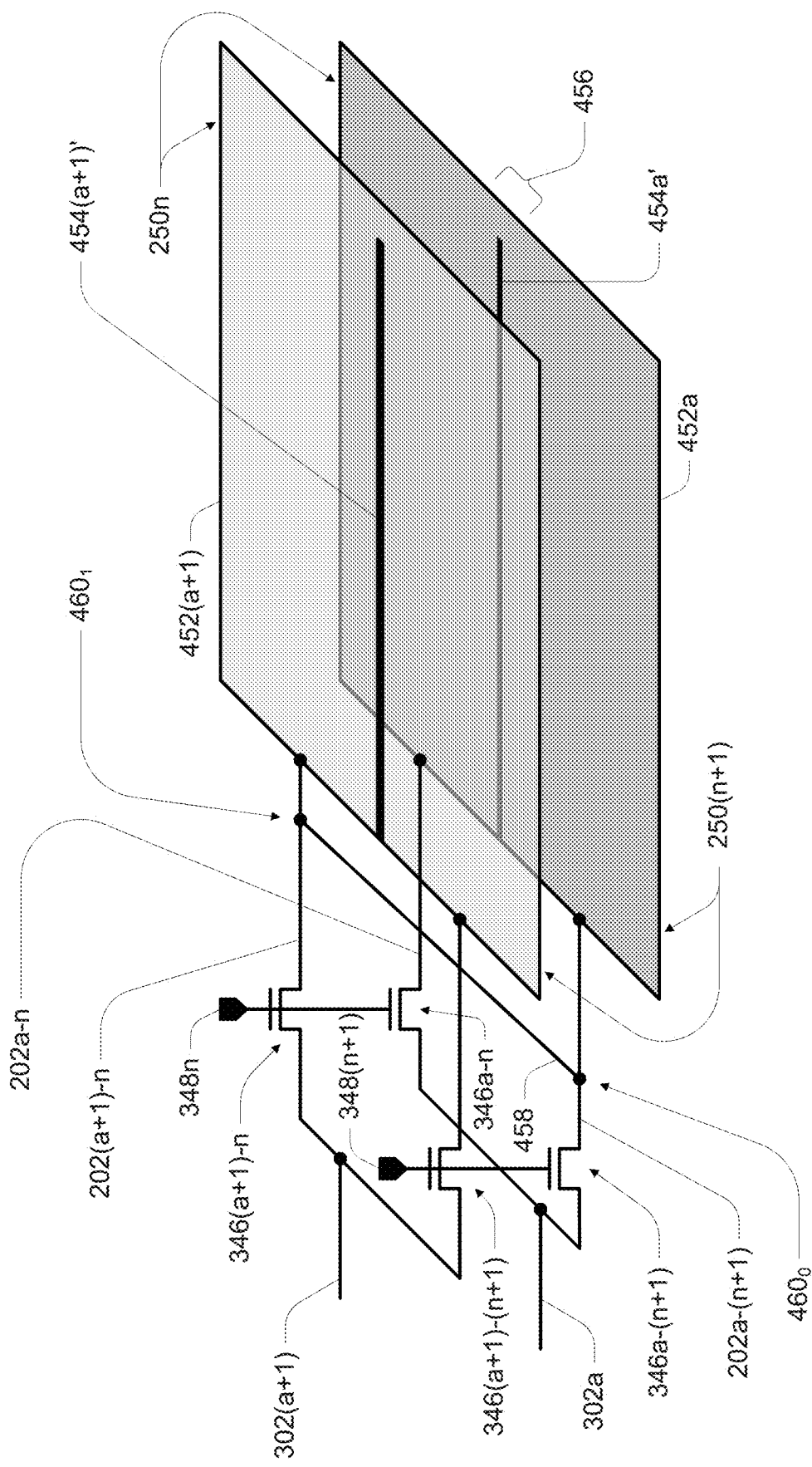
FIG. 4B is a conceptual perspective view of a memory array structure in accordance with an embodiment.

Various embodiments facilitate measurement of resistive characteristics of access lines by providing a current loop through the access lines. Measurement of resistive characteristics of access lines might be used to more accurately determine operational parameters, e.g., voltage levels or timing characteristics, for other access lines deemed to be of similar characteristics. FIG. 4B is a conceptual perspective view of a memory array structure in accordance with an embodiment. Like numbers in FIG. 4B correspond to the description of FIG. 4A.

As depicted in FIG. 4B, the tier corresponding to global access line 302a might utilize a conductive plate 452a, where its isolation region 454a' is not formed to extend a full length of the conductive plate 452a. In this manner, a current path 456 (e.g., a direct electrical connection) might be formed between the block of memory cells 250n and the block of memory cells 250(n+1) for the local access lines 202a-n and 202a-(n+1), respectively. In addition, a current path 458 (e.g., a direct electrical connection) might be formed between a node $460_0$ of the local access line 202a-(n+1) to a node $460_1$ of the local access line 202(a+1)-n. The nodes 460 might occur anywhere between their respective block select transistor 346 and their respective conductive plate 452 forming a portion of their respective local access lines 202, which might include occurring on their respective conductive plate 452. The isolation region 454(a+1)' might be similarly formed in the conductive plate 452(a+1) to form a current path between the block of memory cells 250n and the block of memory cells 250(n+1) for the local access lines 202(a+1)-n and 202(a+1)-(n+1), respectively.

Current paths 456 might be formed for each tier of the blocks of memory cells 250n and 250(n+1). In addition, current paths 458 might be formed for each pair of tiers of the blocks of memory cells 250n and 250(n+1). For example, with reference to FIG. 3, the local access line $202_{0L}$ might have a current path 458 to the local access line $202_{10}$, the local access line $202_{1L}$ might have a current path 458 to the local access line $202_{20}$, and the local access line $202_{2L}$ might have a current path 458 to the local access line $202_{30}$. The purpose of the current paths 456 and 458, e.g., intentional direct electrical connections of circuit elements that are normally electrically isolated from one another, will be described in more detail infra.

It is acknowledged that the current paths 456 and 458 would generally make the blocks of memory cells 250n and 250(n+1) unusable for storage of data. However, it is common to utilize dummy memory cells at the ends of a string of series-connected memory cells to improve operating characteristics of the memory cells of the string of series-connected memory cells that are intended to store data. These dummy memory cells generally have the same structure as memory cells intended to store data. For similar reasoning, dummy blocks of memory cells might also be formed in an array of memory cells, where the dummy blocks of memory cells are formed to have the same structure as blocks of memory cells intended to store data. The current paths 456 and 458 might thus be formed in one or more dummy blocks of memory cells without affecting the storage capacity of the memory.

Figure 5A:
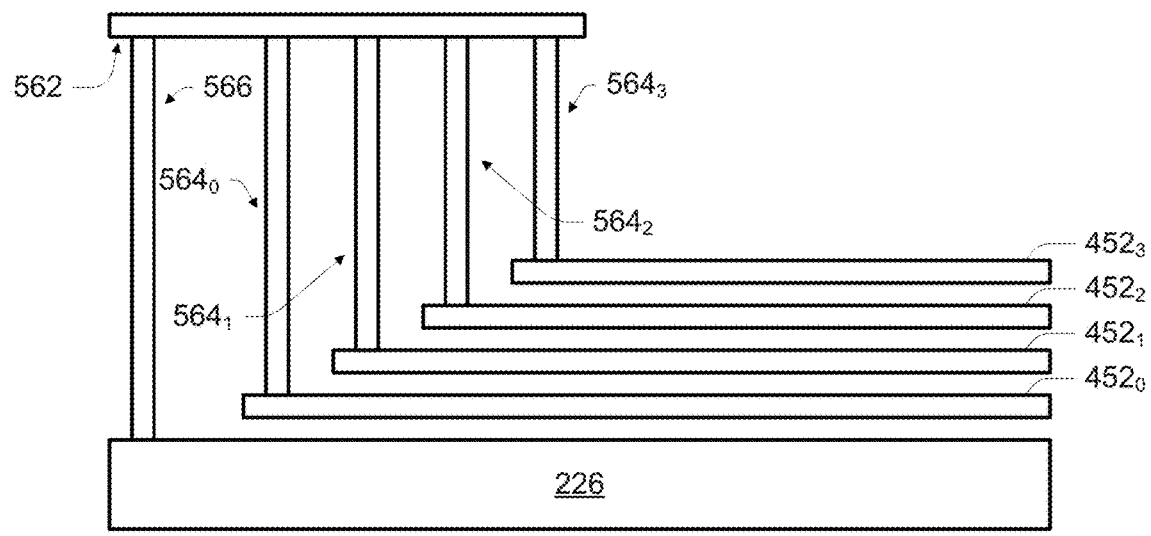
FIGS. 5A-5B are side and planar views, respectively, of a memory array structure in accordance with an embodiment.
Figure 5B:
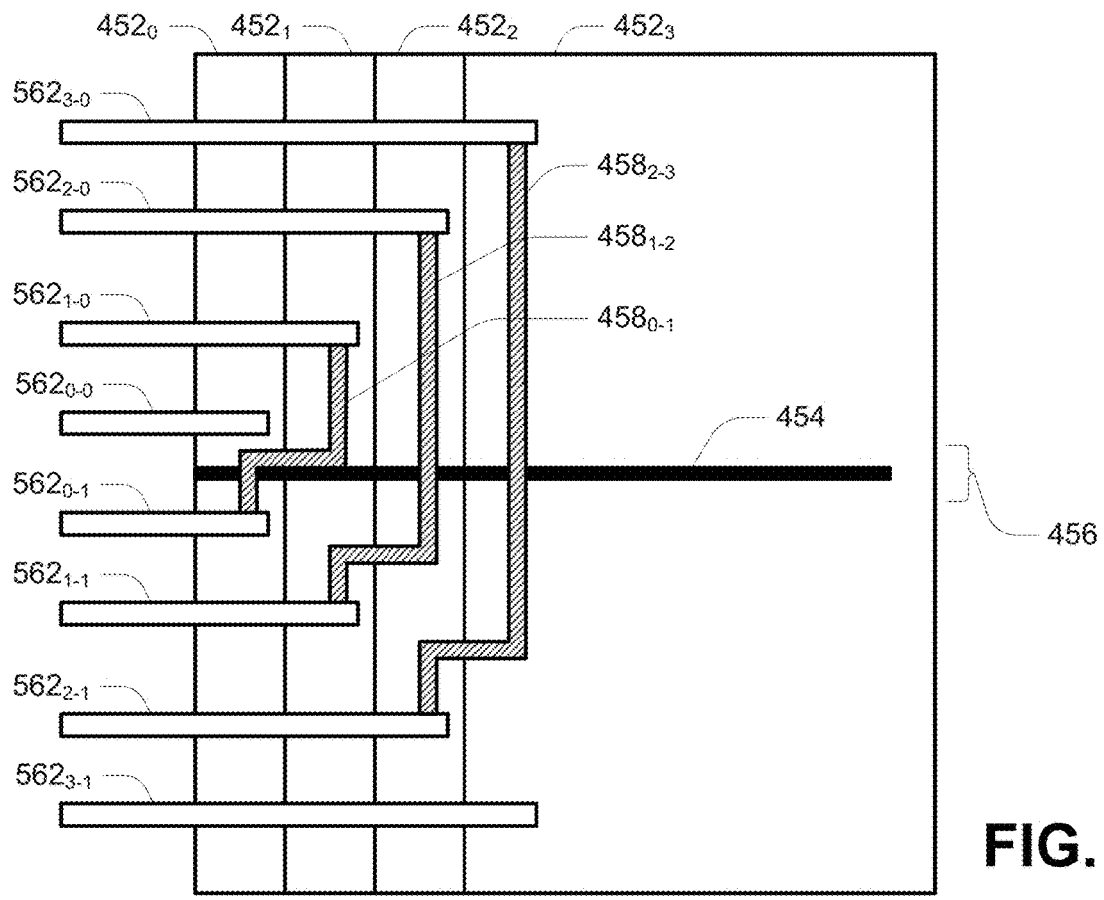

FIGS. 5A-5B are side and planar views, respectively, of a memory array structure in accordance with an embodiment. FIGS. 5A-5B provide one example of forming the current paths 458.

Three-dimensional memory array structures often utilize a staircase structure for the conductive plates 452. FIGS. 5A-5B depict four conductive plates $452_0$, $452_1$, $452_2$ and $452_3$. For simplicity, common source 216, select lines 214 and 215, and data lines 204 are not depicted.

The conductive plate $452_0$ might be connected to a conductor $562_{0-0}$ through a respective contact $564_0$ and connected to a conductor $562_{0-1}$ through a respective contact $564_0$. The contacts $564_0$ for each conductor $562_{0-0}$ and $562_{0-1}$ might both be connected to the peripheral circuitry 226, e.g., for connection to a respective block select transistor. The conductive plate $452_1$ might be connected to a conductor $562_{1-0}$ through a respective contact $564_1$ and connected to a conductor $562_{1-1}$ through a respective contact $564_1$. The contacts $564_1$ for each conductor $562_{1-0}$ and $562_{1-1}$ might both be connected to the peripheral circuitry 226, e.g., for connection to a respective block select transistor. The conductive plate $452_2$ might be connected to a conductor $562_{2-0}$ through a respective contact $564_2$ and connected to a conductor $562_{2-1}$ through a respective contact $564_2$. The contacts $564_2$ for each conductor $562_{2-0}$ and $562_{2-1}$ might both be connected to the peripheral circuitry 226, e.g., for connection to a respective block select transistor. The conductive plate $452_3$ might be connected to a conductor $562_{3-0}$ through a respective contact $564_3$ and connected to a conductor $562_{3-1}$ through a respective contact $564_3$. The contacts $564_3$ for each conductor $562_{3-0}$ and $562_{3-1}$ might both be connected to the peripheral circuitry 226, e.g., for connection to a respective block select transistor. In such a memory array structure, the current path 456 might be formed at an end of its respective conductive plate 452 that is opposite where that conductive plate 452 provides for connection to its respective global access line 302.

A current path $458_{0-1}$ might be formed between the conductor $562_{0-1}$ and the conductor $562_{1-0}$. A current path $458_{1-2}$ might be formed between the conductor $562_{1-1}$ and the conductor $562_{2-0}$. A current path $458_{2-3}$ might be formed between the conductor $562_{2-1}$ and the conductor $562_{3-0}$. The current paths $458_{0-1}$, $458_{1-2}$, and $458_{2-3}$ might be formed of a conductive material at a same level as the conductors 562.

The current paths 456 and 458 provide a current path that might be used to determine resistive characteristics of a local access line. FIG. 6 is a schematic of the array structure of FIG. 4B showing a current path for testing in accordance with an embodiment. Like reference numbers in FIG. 6 correspond to their description in FIGS. 4A and 4B.

With reference to FIG. 6, if the block select line 348n receives a control signal having a logic high level, e.g., to select the block of memory cells 250n, and the block select line 348(n+1) receives a control signal having a logic low level, e.g., to deselect the block of memory cells 250(n+1), a current path 670 might be formed from the global access line 302a, through the block select transistor 346a-n, through the current path 456 to the node $460_0$, through the current path 458 to the node $460_1$, and through the block select transistor 346(a+1)-n to the global access line 302(a+1). If a known voltage level is applied to the global access line 302a while the current path 670 is active, a resulting current level through the global access line 302a might be used to calculate a resistance of the current path 670, which might be used to provide an indication (e.g., estimate) of the resistance of a local access line. For example, the resistance of the current path 670 might be deemed to be equal to the known voltage level divided by the resulting current level. As the current path 670 substantially passes through two lengths of local access lines, e.g., the local access line 202a-(n+1) and the local access line 202a-n, the resistance of the current path 670 might be divided by two to provide an indication (e.g., estimate) of the resistance of the local access line 202a-n or 202a-(n+1). In addition, by deactivating the block select transistors 346a-n and 346(a+1)-n, and activating the block select transistors 346a-(n+1) and 346(a+1)-(n+1), resistance characteristics of the local access lines 202(a+1)-n and 202(a+1)-(n+1) might be similarly determined.

Although the resistance of the current path 670 includes circuit elements other than just the conductive plate 452a, this might be deemed to be insignificant compared to the resistance within the conductive plate 452a alone. Despite this, refinement can be performed using the same circuitry. Note that if both block select lines 348n and 348(n+1) receive control signals having a logic high level, a current path could be formed from the global access line 302a, through the block select transistor 346a-(n+1) to the node $460_0$, through the current path 458 to the node $460_1$, and through the block select transistor 346(a+1)-n to the global access line 302(a+1). If a known voltage level is applied to the global access line 302a while this current path is active, a resulting current level through the global access line 302a might be used to calculate a resistance of the current path without passing through the conductive plate 452a. This resistance might be subtracted from the resistance of the current path 670, which might be used to provide a refined or corrected indication (e.g., estimate) of the resistance of the portion of a local access line corresponding to its conductive plate.

Figure 7:
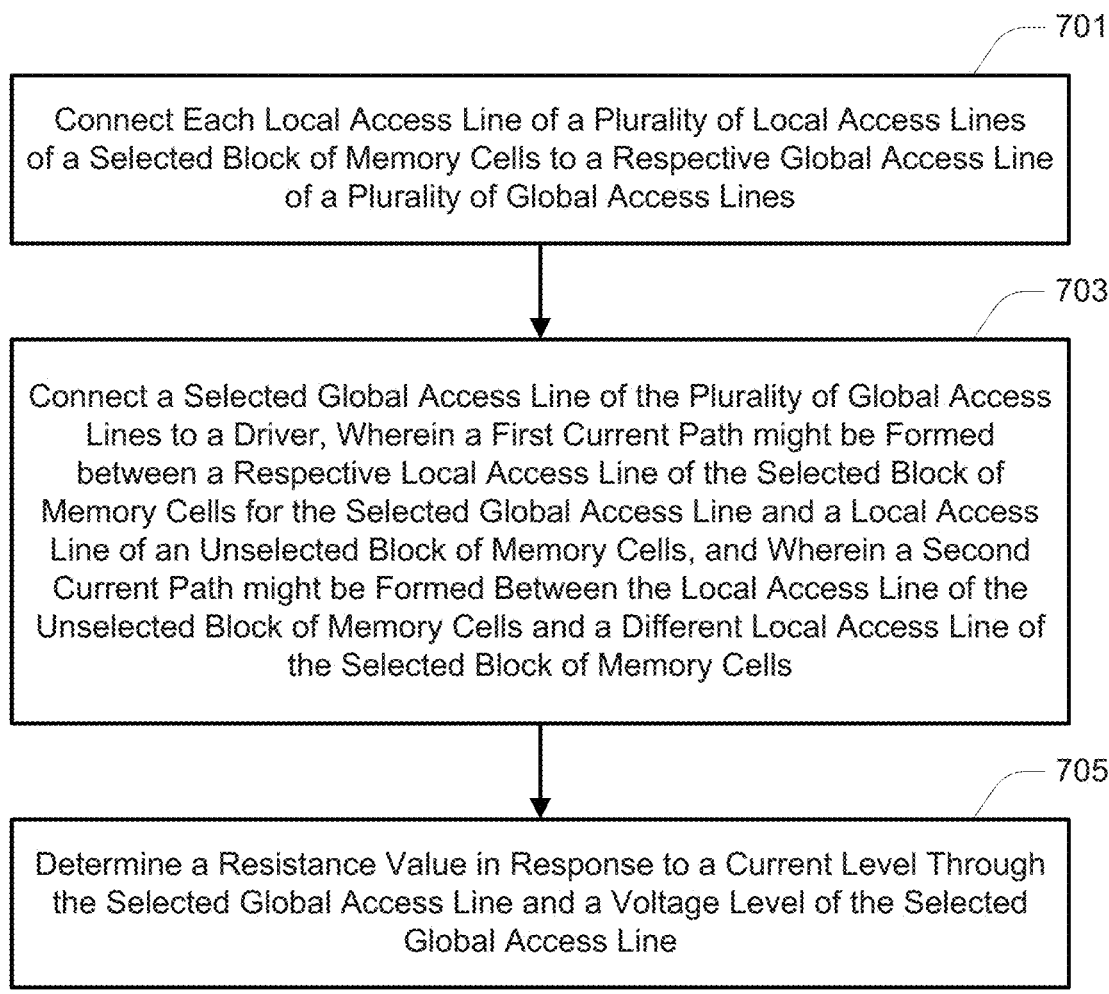
FIG. 7 is a method of operating a memory in accordance with an embodiment.

FIG. 7 is a method of operating a memory in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 701, each local access line of a plurality of local access lines of a selected block of memory cells might be connected to a respective global access line of a plurality of global access lines. At 703, a selected global access line of the plurality of global access lines might be connected to a driver. The driver might apply a known voltage level to the selected global access line or a known current level to the selected global access line. A first current path, e.g., a current path 456, might be formed between a respective local access line of the selected block of memory cells for the selected global access line and a local access line of an unselected block of memory cells. A second current path, e.g., a current path 458, might be formed between the local access line of the unselected block of memory cells and a different local access line of the selected block of memory cells. The unselected block of memory cells might be adjacent (e.g., immediately adjacent) to the selected block of memory cells. The different local access line of the selected block of memory cells might be adjacent (e.g., immediately adjacent) to the respective local access line of the selected block of memory cells for the selected global access line. At 705, a resistance value might be determined in response to a current level through the selected global access line and a voltage level of the selected global access line. The resistance value might be used to determine an indication of a resistance of the respective local access line of the selected block of memory cells, e.g., R≈0.5*V/I. Although the selected block of memory cells might be unavailable for the storage of data due to the current paths 456 and 458, measurement of its resistive characteristics might be deemed to be applicable to other blocks of memory cells, e.g., blocks of memory cells fabricated in the vicinity of the selected block of memory cells. The determined resistance value might be stored, e.g., to the trim register 127, for use in determining operational parameters for performing access operations in the memory.

Figure 8A:
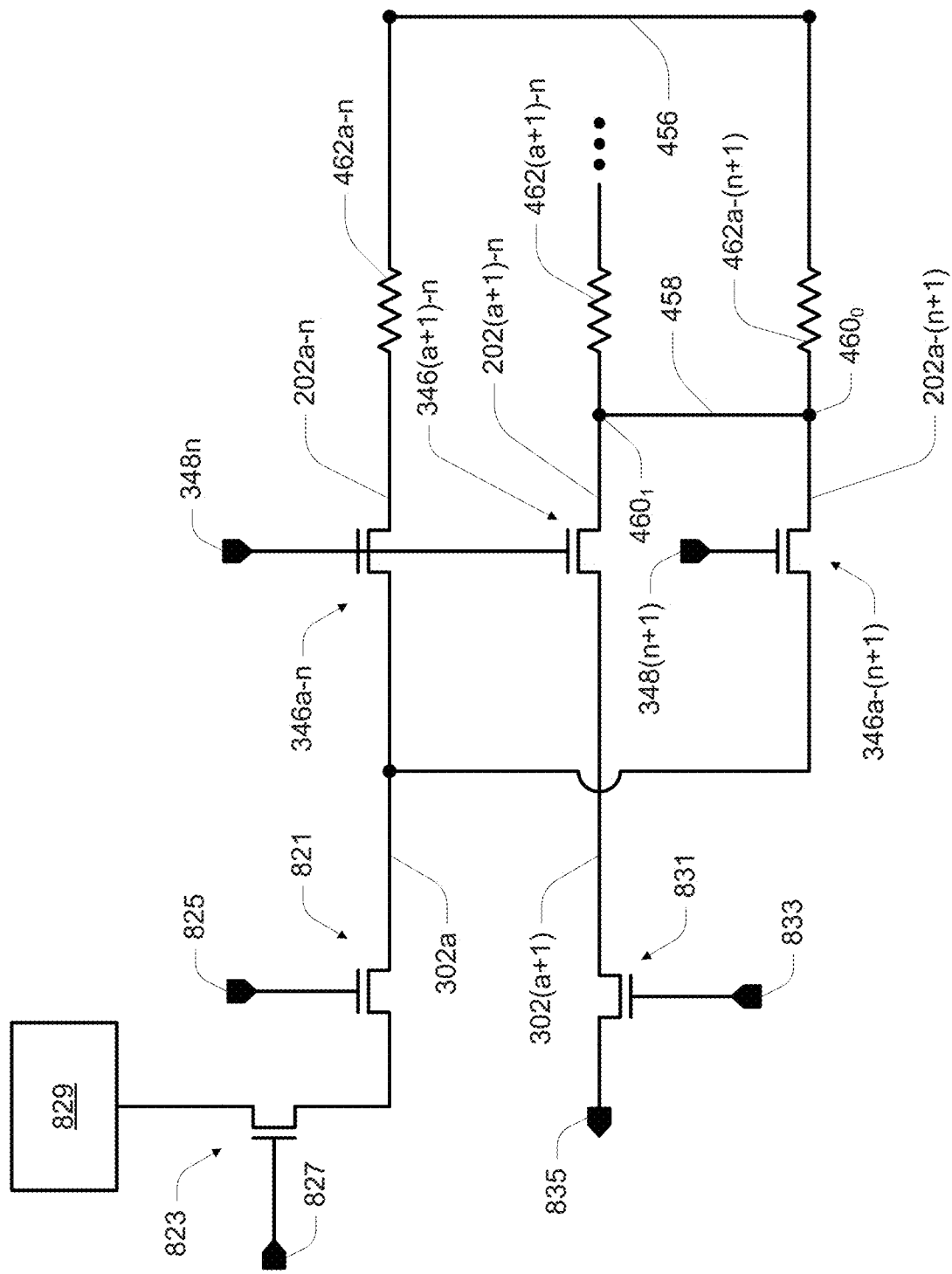
FIG. 8A is a schematic of connections to a memory array structure in accordance with an embodiment as could be used for testing in accordance with an embodiment.

FIG. 8A is a schematic of connections to a memory array structure in accordance with an embodiment as could be used for testing in accordance with an embodiment. Like reference numbers in FIG. 8A correspond to their description in FIGS. 4A and 4B. The resistance 462a-n might represent a resistance of the conductive plate 452a for the local access line 202a-n. The resistance 462(a+1)-n might represent a resistance of the conductive plate 452(a+1) for the local access line 202(a+1)-n. The resistance 462a-(n+1) might represent a resistance of the conductive plate 452a for the local access line 202a-(n+1).

The global access line 302a might be selectively connected to a driver 829 through a transistor (e.g., nFET) 821 and a transistor (e.g., nFET) 823. The driver 829 might be a voltage generator, e.g., configured to generate a known voltage level. Alternatively, the driver 829 might represent a voltage node configured to receive a supply voltage. For example, the voltage node might be configured to receive a top-rail supply voltage, such as the supply voltage Vcc. Note that the connection of the global access line 302a to voltage generation circuitry, e.g., for generating and applying voltage levels for normal access operations, is not depicted in FIG. 8A for simplicity.

The transistor 821 might be a global access line select transistor to selectively connect global access line 302a to other circuitry, such as a voltage generator configured to provide varying voltage levels for access of the array of memory cells. The transistor 821 might be responsive to a control signal received on node 825. The transistor 823 might be an enable transistor for testing as described herein. The transistor 823 might be responsive to a control signal received on node 827.

The global access line 302(a+1) might be selectively connected to a node 835 through a transistor (e.g., nFET) 831. The transistor 831 might be a global access line select transistor to selectively connect to global access line 302(a+1) to other circuitry, such as a voltage generator configured to provide varying voltage levels for access of the array of memory cells. The transistor 831 might be responsive to a control signal received on node 833. The node 835 might be a conductive node providing for electrical connection to an external device. The node 835 might be accessible during fabrication or subsequent to packaging, for example. A resistance value of the current path through the resistance 462a-n, the current path 456, the resistance 462a-(n+1), and the current path 458 to the node 835 might be determined in response to a voltage level of the driver 829 (e.g., a voltage difference between the voltage level of the driver 829 and the node 835), and a current level that might be measured at the node 835.

Figure 8B:
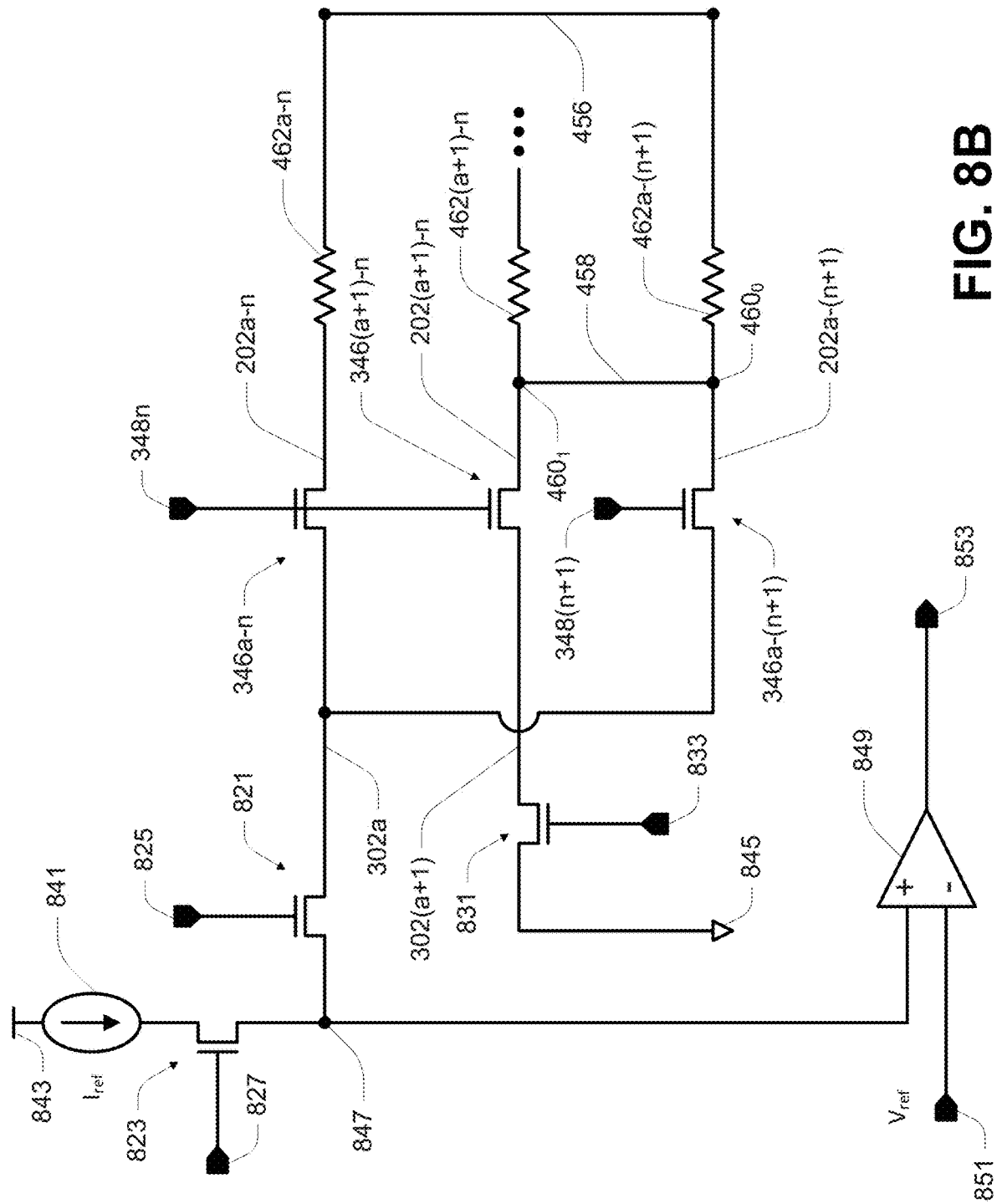
FIG. 8B is a schematic of connections to a memory array structure in accordance with an embodiment as could be used for testing in accordance with another embodiment.

FIG. 8B is a schematic of connections to a memory array structure in accordance with an embodiment as could be used for testing in accordance with another embodiment. Like reference numbers in FIG. 8B correspond to their description in FIGS. 4A and 4B, and FIG. 8A. While the circuit of FIG. 8A provided for driving a known voltage level on the global access line 302a, the circuit of FIG. 8B might provide for driving a known current level on the global access line 302a.

The global access line 302a might be selectively connected to a driver, e.g., a current source 841, through a transistor (e.g., nFET) 821 and a transistor (e.g., nFET) 823. The current source 841 (e.g., a current mirror) might be connected to a voltage node 843, which might be configured to receive a top-rail supply voltage, such as the supply voltage Vcc. The current source 841 might generate the known current level Iref. Note that the connection of the global access line 302a to voltage generation circuitry, e.g., for generating and applying voltage levels for normal access operations, is not depicted in FIG. 8B for simplicity.

The transistor 821 might be a global access line select transistor to selectively connect global access line 302a to other circuitry, such as a voltage generator configured to provide varying voltage levels for access of the array of memory cells. The transistor 821 might be responsive to a control signal received on node 825. The transistor 823 might be an enable transistor for testing as described herein. The transistor 823 might be responsive to a control signal received on node 827.

The global access line 302(a+1) might be selectively connected to a voltage node 845 through a transistor (e.g., nFET) 831. The transistor 831 might be a global access line select transistor to selectively connect to global access line 302(a+1) to other circuitry, such as a voltage generator configured to provide varying voltage levels for access of the array of memory cells. The transistor 831 might be responsive to a control signal received on node 833. The voltage node 845 might be configured to receive a bottom-rail supply voltage, e.g., a reference potential, such as the supply voltage Vss, which might be ground or 0V.

Upon activation of the transistors 821 and 823, the node 847 might be connected to the global access line 302a and to the current source 841. The node 847 might further be connected to a first input (e.g., a non-inverting input) of a comparator 849. A second input (e.g., an inverting input) of the comparator 849 might be connected to a voltage node 851. The voltage node 851 might be configured to receive a variable voltage level. The comparator 849 further includes an output 853. By varying the voltage level of the voltage node 851 while applying the current level Iref to the global access line 302a, a transition of the output 853 of the comparator 849 might be used to indicate a voltage level of the global access line 302a responsive to the application of the current level Iref. A resistance value of the current path through the resistance 462a-n, the current path 456, the resistance 462a-(n+1), and the current path 458 to the voltage node 845 might be determined in response to a voltage level of the voltage node 851 determined in response to a transition of the comparator 849, and the current level Iref.

Figure 8C:
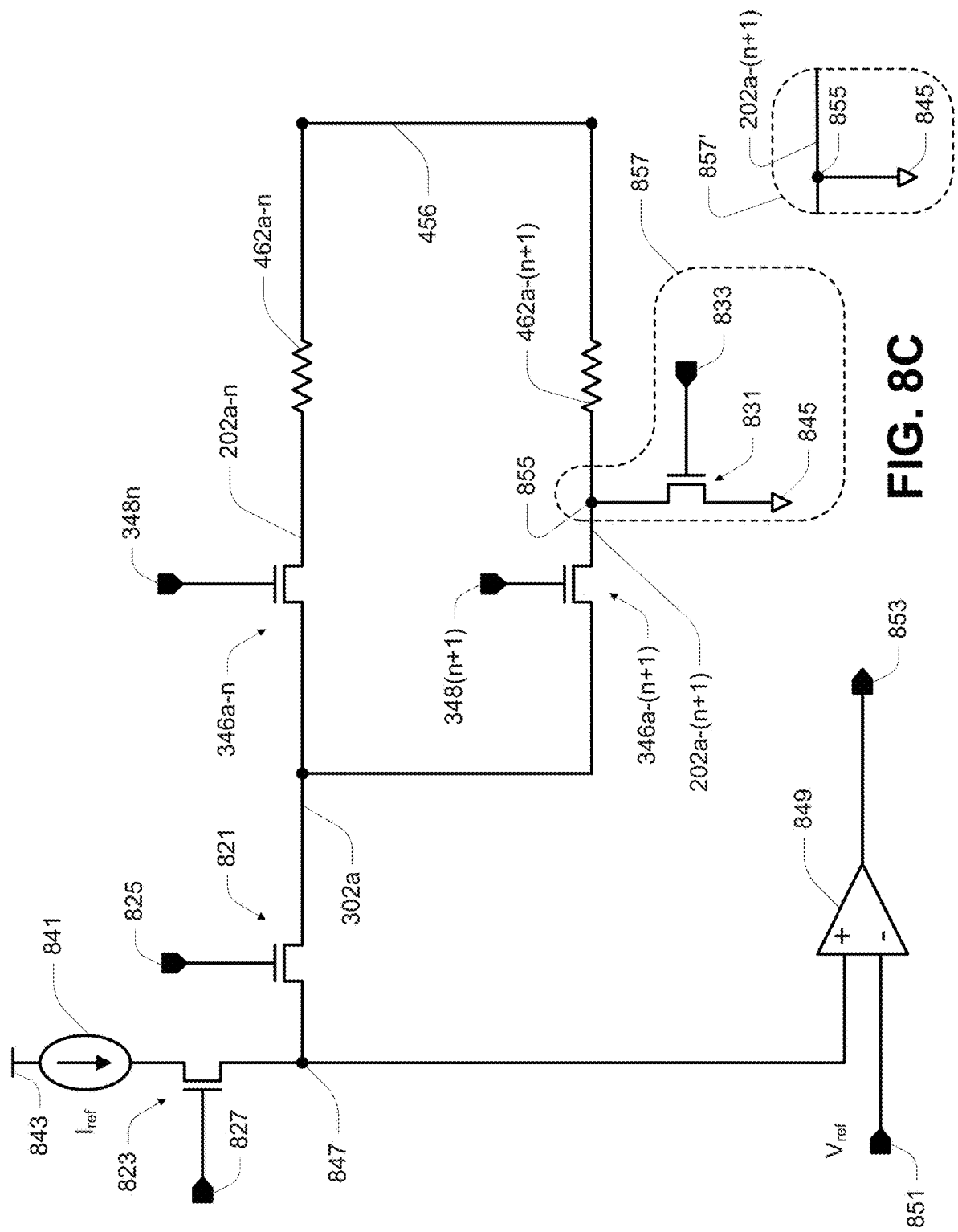
FIG. 8C is a schematic of connections to a memory array structure in accordance with an embodiment as could be used for testing in accordance with a further embodiment.

FIG. 8C is a schematic of connections to a memory array structure in accordance with an embodiment as could be used for testing in accordance with a further embodiment. Like reference numbers in FIG. 8C correspond to their description in FIGS. 4A and 4B, and FIG. 8A. While the circuit of FIG. 8A provided for driving a known voltage level on the global access line 302a, the circuit of FIG. 8C might provide for driving a known current level on the global access line 302a.

The circuit of FIG. 8C provides an alternate current path between the global access line 302a and a voltage node. For example, instead of using a current path 458 such as described in FIG. 8B, the circuit of FIG. 8C provides for connection of the global access line 302a to a voltage node 845 without its connection to another global access line.

The global access line 302a might be selectively connected to a driver, e.g., a current source 841, through a transistor (e.g., nFET) 821 and a transistor (e.g., nFET) 823. The current source 841 (e.g., a current mirror) might be connected to a voltage node 843, which might be configured to receive a top-rail supply voltage, such as the supply voltage Vcc. The current source 841 might generate the known current level Iref. Note that the connection of the global access line 302a to voltage generation circuitry, e.g., for generating and applying voltage levels for normal access operations, is not depicted in FIG. 8C for simplicity.

The transistor 821 might be a global access line select transistor to selectively connect global access line 302a to other circuitry, such as a voltage generator configured to provide varying voltage levels for access of the array of memory cells. The transistor 821 might be responsive to a control signal received on node 825. The transistor 823 might be an enable transistor for testing as described herein. The transistor 823 might be responsive to a control signal received on node 827.

The local access line 202a-(n+1) might have a node 855 connected (e.g., selectively connected) to a voltage node 845 through a transistor (e.g., nFET) 831 as shown in dashed outline 857. The transistor 831 might be responsive to a control signal received on node 833. The voltage node 845 might be configured to receive a bottom-rail supply voltage, e.g., a reference potential, such as the supply voltage Vss, which might be ground or 0V. Alternatively, the node 855 of the local access line 202a-(n+1) might be connected (e.g., directly connected, without intervening selective elements) to a voltage node 845 as shown in dashed outline 857'. The node 855 of the local access line 202a-(n+1) might be positioned between the block select transistor 346a-(n+1) and the resistance 462a-(n+1) (e.g., of the conductive plate 452a of FIG. 4B) for the local access line 202a-(n+1).

Upon activation of the transistors 821 and 823, the node 847 might be connected to the global access line 302a and to the current source 841. The node 847 might further be connected to a first input (e.g., a non-inverting input) of a comparator 849. A second input (e.g., an inverting input) of the comparator 849 might be connected to a voltage node 851. The voltage node 851 might be configured to receive a variable voltage level. The comparator 849 further includes an output 853. By varying the voltage level of the voltage node 851 while applying the current level Iref to the global access line 302a, a transition of the output 853 of the comparator 849 might be used to indicate a voltage level of the global access line 302a responsive to the application of the current level Iref. A resistance value of the current path through the resistance 462a-n, the current path 456, and the resistance 462a-(n+1) to the voltage node 845 might be determined in response to a voltage level of the voltage node 851 determined in response to a transition of the comparator 849, and the current level Iref.

Figure 9:
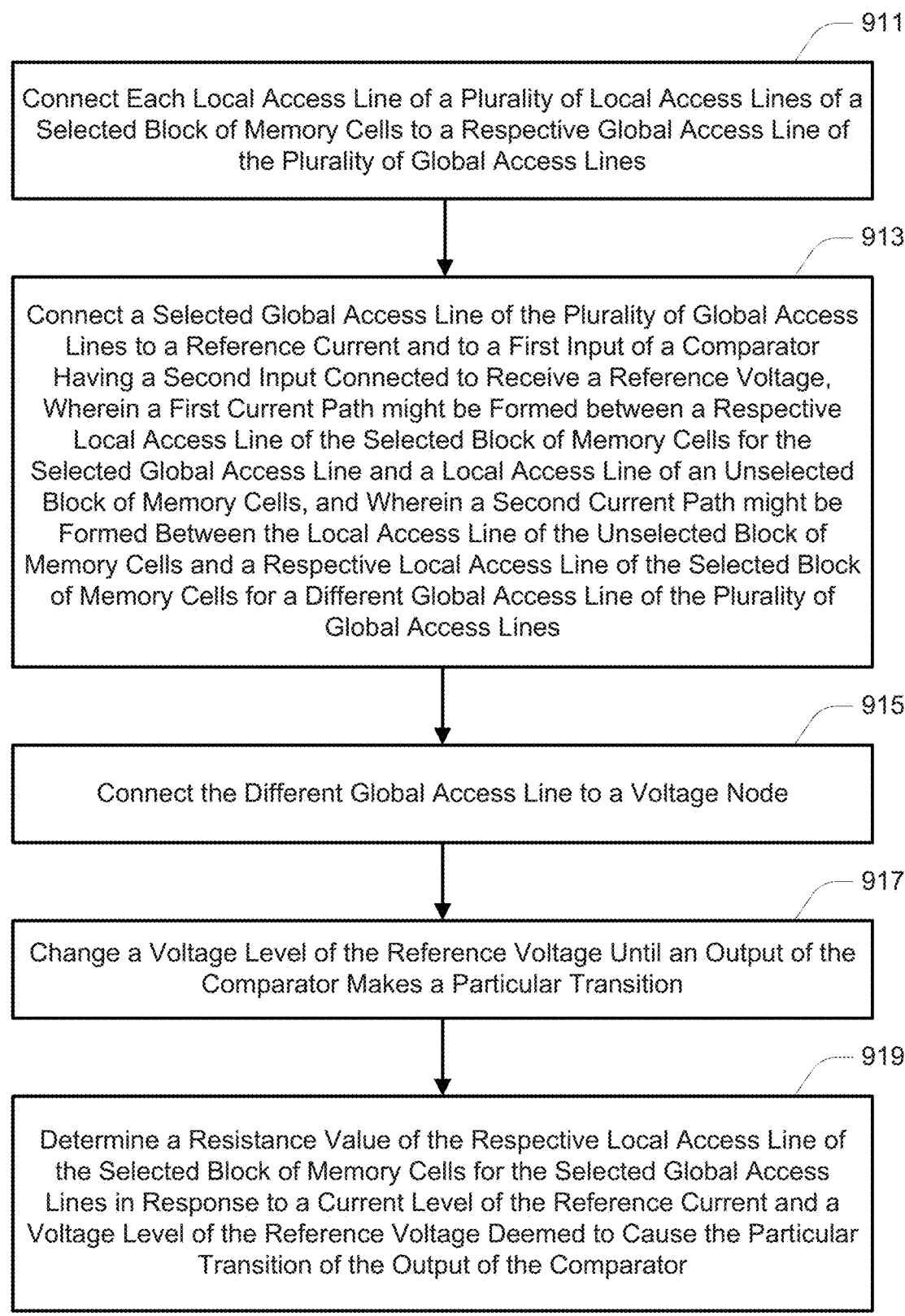
FIG. 9 is a method of operating a memory in accordance with an embodiment.

FIG. 9 is a method of operating a memory in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 911, each local access line of a plurality of local access lines of a selected block of memory cells might be connected to a respective global access line of a plurality of global access lines. At 913, a selected global access line of the plurality of global access lines might be connected to a reference current and to a first input of a comparator having a second input connected to receive a reference voltage. A first current path, e.g., a current path 456, might be formed between a respective local access line of the selected block of memory cells for the selected global access line and a local access line of an unselected block of memory cells. A second current path, e.g., a current path 458, might be formed between the local access line of the unselected block of memory cells and a respective local access line of the selected block of memory cells for a different global access line of the plurality of global access lines. The unselected block of memory cells might be adjacent (e.g., immediately adjacent) to the selected block of memory cells. The respective local access line of the selected block of memory cells for the different global access line might be adjacent (e.g., immediately adjacent) to the respective local access line of the selected block of memory cells for the selected global access line.

At 915, the different global access line might be connected to a voltage node. The voltage node might be configured to receive a bottom-rail supply voltage, e.g., a reference potential, such as the supply voltage Vss, which might be ground or 0V. At 917, a voltage level of the reference voltage might be change (e.g., increased) until an output of the comparator makes a particular transition. For example, if the comparator output has a first logic level, e.g., a logic low level, when the voltage level of the reference voltage is lower than the voltage level of the selected global access line while the reference current is applied, and a second logic level, e.g., a logic high level, when the voltage level of the reference voltage is higher than the voltage level of the selected global access line while the reference current is applied, the particular transition of the comparator might be a transition from its first logic level to its second logic level in response to increasing the voltage level of the reference voltage.

At 919, e.g., in response to the particular transition of the comparator, a resistance value of the respective local access line of the selected block of memory cells for the selected global access line might be determined in response to a current level of the reference current and a voltage level of the reference voltage deemed to cause the particular transition of the output of the comparator. For example, where the current level of the reference current is Iref, and the voltage level of the reference voltage deemed to cause the particular transition of the output of the comparator is Vdet, the resistance value of the respective local access line of the selected block of memory cells for the selected global access line might be deemed to be equal to 0.5*Vdet/Iref. As discussed with reference to FIG. 6, a correction could be applied.

Figure 10:
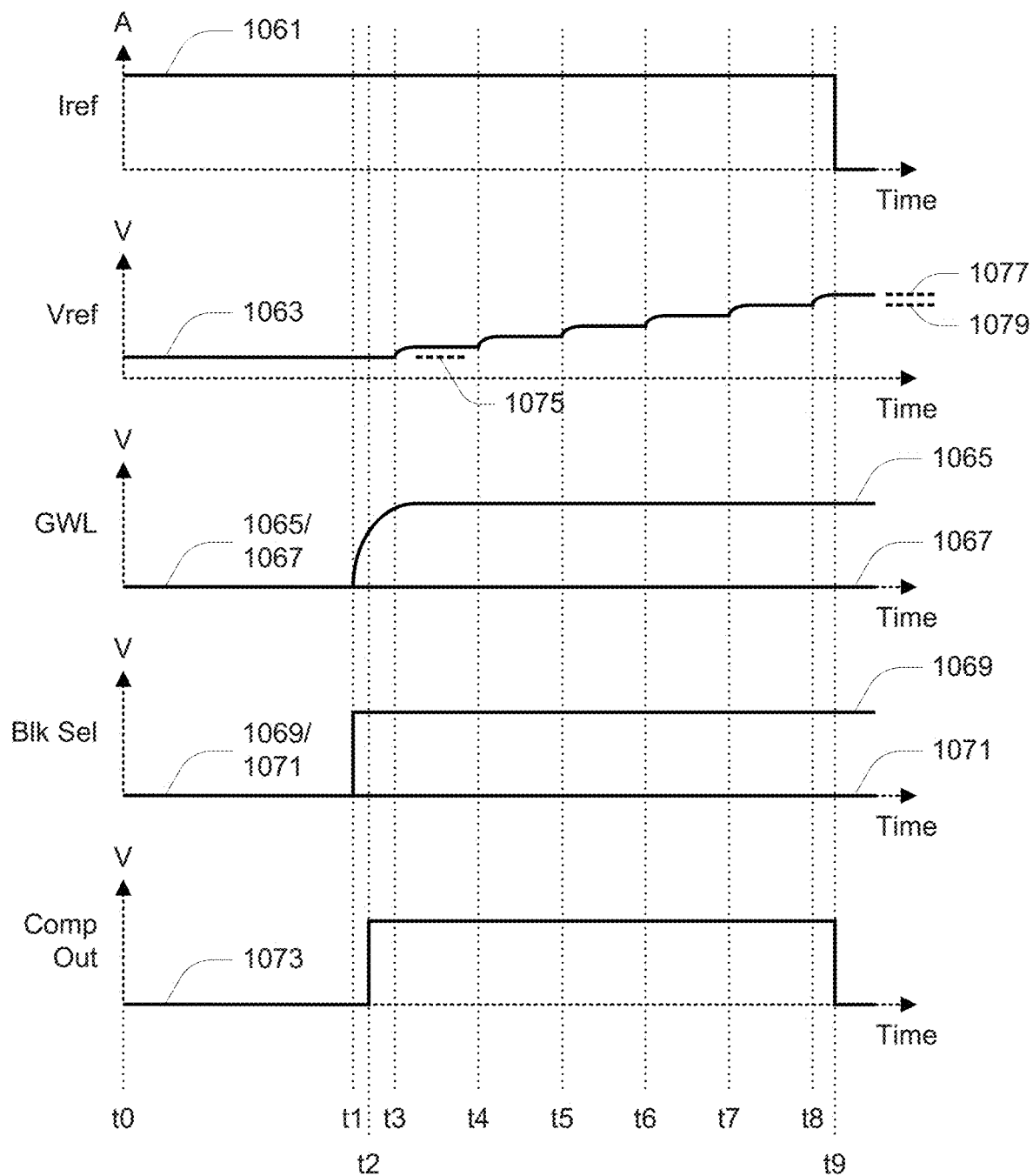
FIG. 10 depicts timing of various parameters of FIG. 8B in accordance with an embodiment.

FIG. 10 depicts timing of various parameters of FIG. 8B in accordance with an embodiment. FIG. 10 might correspond to a method of the type discussed with reference to FIG. 9. Trace 1061 might correspond to the current level of the reference current Iref over time. Trace 1063 might correspond to the voltage level of the reference voltage Vref over time. Trace 1065 might correspond to the voltage level of the global access line 302a over time. Trace 1067 might correspond to the voltage level of the global access line 302(a+1) over time. Trace 1069 might correspond to the voltage level of the block select line 348n over time. Trace 1071 might correspond to the voltage level of the block select line 348(n+1) over time. Trace 1073 might correspond to the logic level of the output 853 of the comparator 849 over time.

At time t0, each of the global access lines 302 might be connected to receive a reference potential, e.g., ground or 0V. The block select lines 348 might each provide a control signal having a logic low level. And the comparator 849 might have a logic low level at its output 853.

At time t1, the block select line 348n might provide a control signal having a logic high level to connect its local access lines 202 of the selected block of memory cells 250n to its global access lines 302. The block select line 438(n+1) might remain at a logic low level to deselect the block of memory cells 250(n+1). Concurrently, the global access line 302a might be connected to the reference current Iref, e.g., through activation of the transistors 821 and 823. As a result, its voltage level might begin to increase. At time t2, in response to the voltage level of the global access line 302a increasing to a point that it is higher than the voltage level of the reference voltage Vref, the logic level of the output 853 of the comparator 849 might transition to a logic high level.

At time t3, the reference voltage Vref might be increased from an initial voltage level 1075. The initial voltage level 1075 might be selected to be less than an expected voltage level of the global access line 302a in response to application of the reference current Iref. The voltage level of the reference voltage Vref might be selected to be 0V, or it might be selected to be some higher voltage level. Selection of an initial voltage level 1075 higher than 0V might reduce a number of increases of the reference voltage Vref necessary to cause a transition of the output 853 of the comparator 849. Similarly, smaller voltage level increases per step might facilitate increased accuracy of the resistance determination, while larger voltage level increases per step might facilitate increase speed of the determination.

In response to the output 853 of the comparator 849 maintaining its logic level in response to the voltage level increase of the reference voltage Vref at time t3, the reference voltage Vref might be increased again at time t4. This process might be repeated for times t5, t6, t7 and t8. At time t9, in response to the voltage level of the reference voltage Vref increasing to a point that it is higher than the voltage level of the global access line 302a, the logic level of the output 853 of the comparator 849 might transition to a logic low level. For some embodiments, the voltage level of the reference voltage Vref deemed to cause the particular transition of the output 853 of the comparator 849 might be the voltage level 1077, e.g., the voltage level to which the reference voltage Vref was increased at time t8. For other embodiments, the voltage level of the reference voltage Vref deemed to cause the particular transition of the output 853 of the comparator 849 might be the voltage level 1079, e.g., the voltage level of the reference voltage Vref prior to its increase at time t8. For further embodiments, the voltage level of the reference voltage Vref deemed to cause the particular transition of the output 853 of the comparator 849 might be determined in response to the voltage level 1077, e.g., the voltage level to which the reference voltage Vref was increased at time t8, and the voltage level 1079, e.g., the voltage level of the reference voltage Vref prior to its increase at time t8. For such embodiments, the voltage level of the reference voltage Vref deemed to cause the particular transition of the output 853 of the comparator 849 might be an average of the voltage level 1077 and the voltage level 1079, for example.

Figure 11:
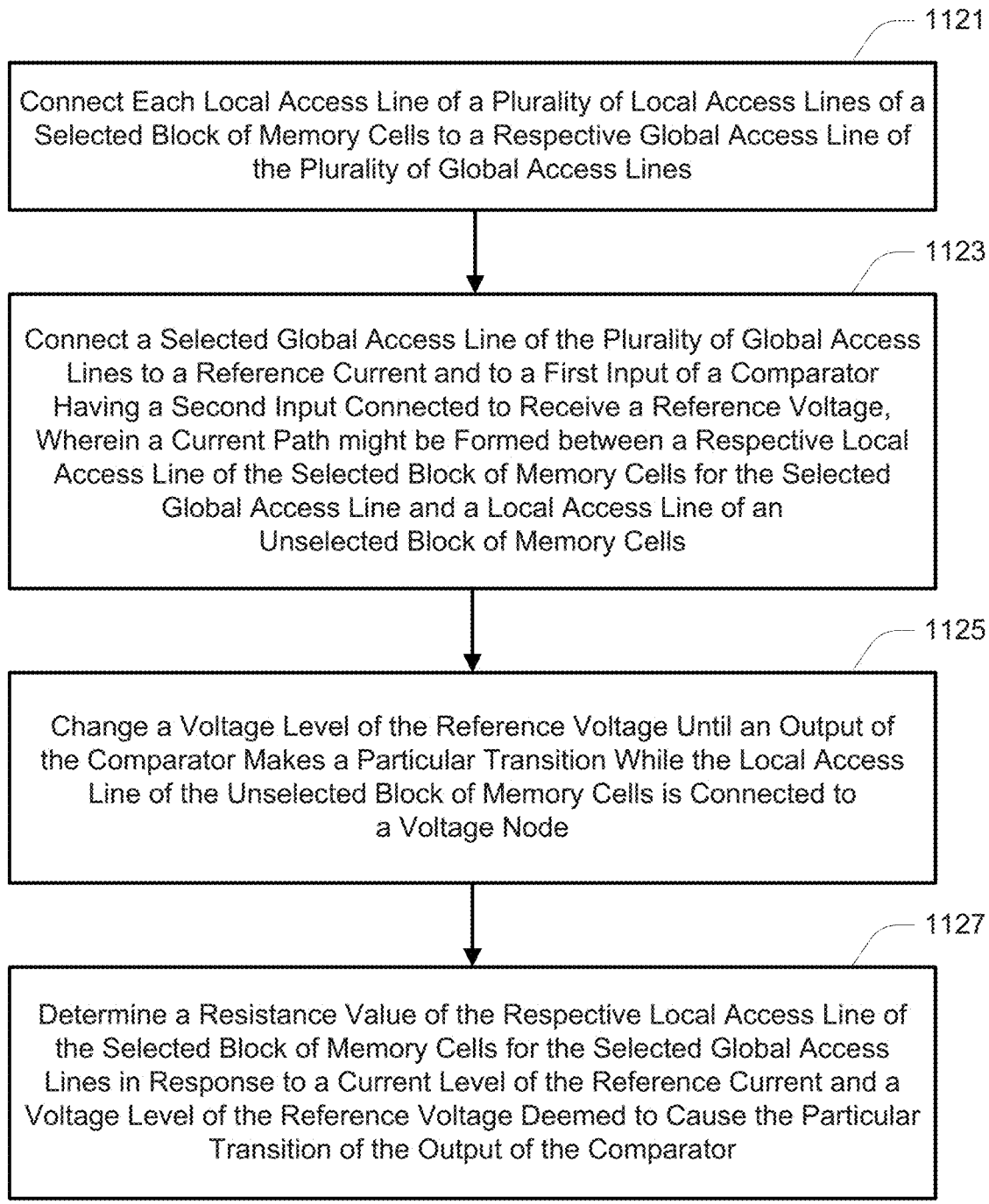
FIG. 11 is a method of operating a memory in accordance with an embodiment.

FIG. 11 is a method of operating a memory in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 1121, each local access line of a plurality of local access lines of a selected block of memory cells might be connected to a respective global access line of a plurality of global access lines. At 1123, a selected global access line of the plurality of global access lines might be connected to a reference current and to a first input of a comparator having a second input connected to receive a reference voltage. A current path, e.g., a current path 456, might be formed between a respective local access line of the selected block of memory cells for the selected global access line and a local access line of an unselected block of memory cells. The unselected block of memory cells might be adjacent (e.g., immediately adjacent) to the selected block of memory cells. The respective local access line of the selected block of memory cells for the different global access line might be adjacent (e.g., immediately adjacent) to the respective local access line of the selected block of memory cells for the selected global access line.

At 1125, a voltage level of the reference voltage might be change (e.g., increased) until an output of the comparator makes a particular transition while the local access line of the unselected block of memory cells is connected to a voltage node. The voltage node might be configured to receive a bottom-rail supply voltage, e.g., a reference potential, such as the supply voltage Vss, which might be ground or 0V.

For example, if the comparator output has a first logic level, e.g., a logic low level, when the voltage level of the reference voltage is lower than the voltage level of the selected global access line, and a second logic level, e.g., a logic high level, when the voltage level of the reference voltage is higher than the voltage level of the selected global access line, the particular transition of the comparator might be a transition from its first logic level to its second logic level in response to increasing the voltage level of the reference voltage.

At 1127, e.g., in response to the particular transition of the comparator, a resistance value of the respective local access line of the selected block of memory cells for the selected global access line might be determined in response to a current level of the reference current and a voltage level of the reference voltage deemed to cause the particular transition of the output of the comparator. For example, where the current level of the reference current is Iref, and the voltage level of the reference voltage deemed to cause the particular transition of the output of the comparator is Vdet, the resistance value of the respective local access line of the selected block of memory cells for the selected global access line might be deemed to be equal to 0.5*Vdet/Iref.

Figure 12:
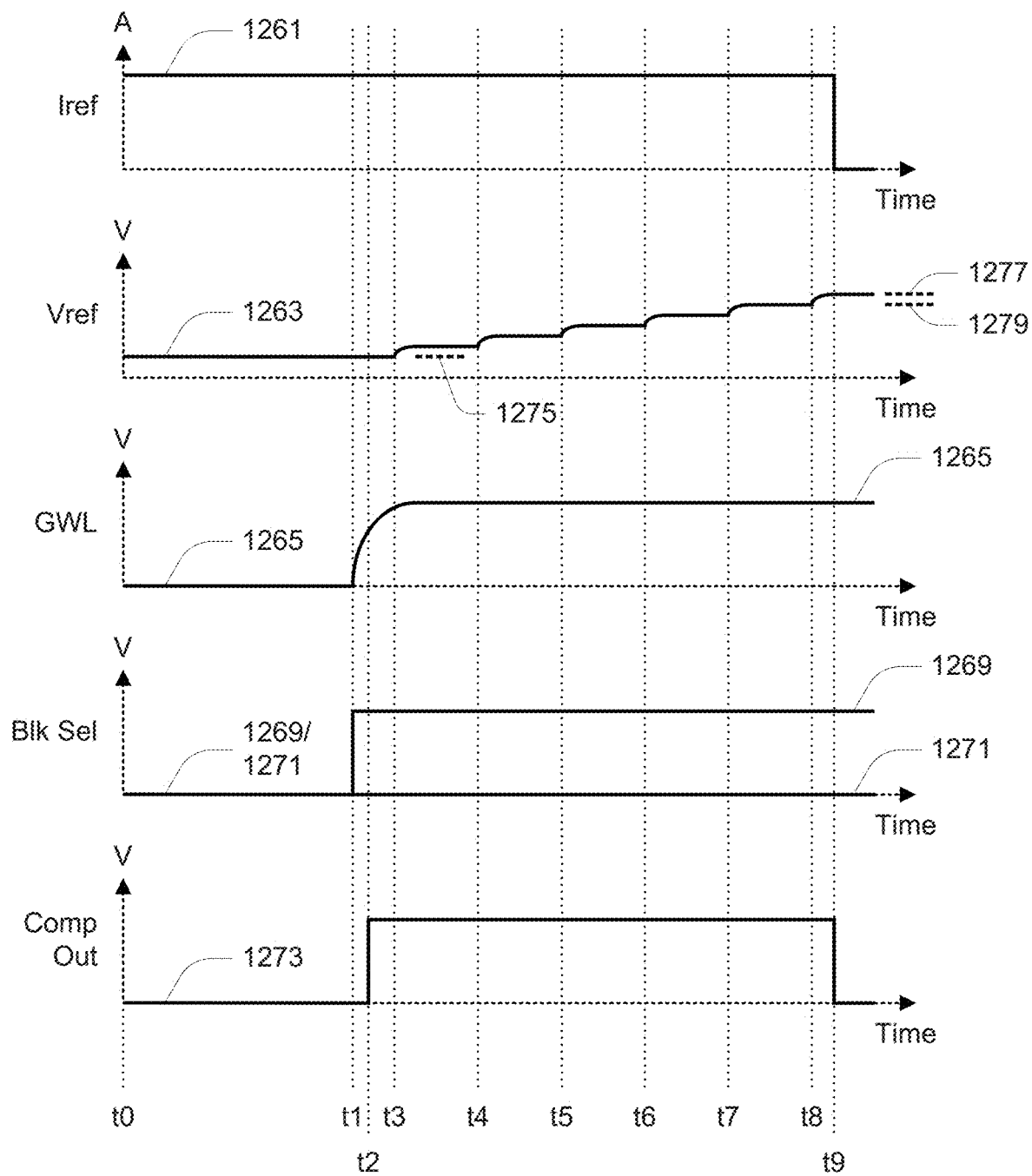
FIG. 12 depicts timing of various parameters of FIG. 8C in accordance with an embodiment.

FIG. 12 depicts timing of various parameters of FIG. 8C in accordance with an embodiment. FIG. 12 might correspond to a method of the type discussed with reference to FIG. 11. Trace 1261 might correspond to the current level of the reference current Iref over time. Trace 1263 might correspond to the voltage level of the reference voltage Vref over time. Trace 1265 might correspond to the voltage level of the global access line 302a over time. Trace 1269 might correspond to the voltage level of the block select line 348n over time. Trace 1271 might correspond to the voltage level of the block select line 348(n+1) over time. Trace 1273 might correspond to the logic level of the output 853 of the comparator 849 over time.

At time t0, each of the global access lines 302 might be connected to receive a reference potential, e.g., ground or 0V. The block select lines 348 might each provide a control signal having a logic low level. And the comparator 849 might have a logic low level at its output 853.

At time t1, the block select line 348n might provide a control signal having a logic high level to connect its local access lines 202 of the selected block of memory cells 250n to its global access lines 302. Concurrently, the global access line 302a might be connected to the reference current Iref, e.g., through activation of the transistors 821 and 823. As a result, its voltage level might begin to increase. At time t2, in response to the voltage level of the global access line 302a increasing to a point that it is higher than the voltage level of the reference voltage Vref, the logic level of the output 853 of the comparator 849 might transition to a logic high level.

At time t3, the reference voltage Vref might be increased from an initial voltage level 1275. The initial voltage level 1275 might be selected to be less than an expected voltage level of the global access line 302a in response to application of the reference current Iref. The voltage level of the reference voltage Vref might be selected to be 0V, or it might be selected to be some higher voltage level. Selection of an initial voltage level 1275 higher than 0V might reduce a number of increases of the reference voltage Vref necessary to cause a transition of the output 853 of the comparator 849. Similarly, smaller voltage level increases per step might facilitate increased accuracy of the resistance determination, while larger voltage level increases per step might facilitate increase speed of the determination.

In response to the output 853 of the comparator 849 maintaining its logic level in response to the voltage level increase of the reference voltage Vref at time t3, the reference voltage Vref might be increased again at time t4. This process might be repeated for times t5, t6, t7 and t8. At time t9, in response to the voltage level of the reference voltage Vref increasing to a point that it is higher than the voltage level of the global access line 302a, the logic level of the output 853 of the comparator 849 might transition to a logic low level. For some embodiments, the voltage level of the reference voltage Vref deemed to cause the particular transition of the output 853 of the comparator 849 might be the voltage level 1277, e.g., the voltage level to which the reference voltage Vref was increased at time t8. For other embodiments, the voltage level of the reference voltage Vref deemed to cause the particular transition of the output 853 of the comparator 849 might be the voltage level 1279, e.g., the voltage level of the reference voltage Vref prior to its increase at time t8. For further embodiments, the voltage level of the reference voltage Vref deemed to cause the particular transition of the output 853 of the comparator 849 might be determined in response to the voltage level 1277, e.g., the voltage level to which the reference voltage Vref was increased at time t8, and the voltage level 1279, e.g., the voltage level of the reference voltage Vref prior to its increase at time t8. For such embodiments, the voltage level of the reference voltage Vref deemed to cause the particular transition of the output 853 of the comparator 849 might be an average of the voltage level 1277 and the voltage level 1279, for example.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory array structure, comprising:
    a first block of memory cells including a first plurality of local access lines, wherein each local access line of the first plurality of local access lines is connected to control gates of a respective plurality of memory cells of the first block of memory cells;
    a second block of memory cells including a second plurality of local access lines, wherein each local access line of the second plurality of local access lines is connected to control gates of a respective plurality of memory cells of the second block of memory cells;
    a plurality of data lines, wherein each data line of the plurality of data lines is selectively connected to a memory cell of the respective plurality of memory cells of the first block of memory cells for each access line of the first plurality of access lines, and selectively connected to a memory cell of the respective plurality of memory cells of the second block of memory cells for each access line of the second plurality of access lines; and
    a first current path as a permanent electrical connection between a particular local access line of the first plurality of local access lines and a particular local access line of the second plurality of local access lines; and
    second current path as a permanent electrical connection between the particular local access line of the first plurality of local access lines and a different local access line of the second plurality of local access.

2. The memory array structure of claim 1, wherein the particular local access line of the second plurality of local access lines is immediately adjacent the particular local access line of the first plurality of local access lines.

3. The memory array structure of claim 1, wherein the memory array structure, for each local access line of the first plurality of local access lines, further comprises:
    a respective first current path as a permanent electrical connection between that local access line of the first plurality of local access lines and a first respective local access line of the second plurality of local access lines; and
    a respective second current path as a permanent electrical connection in between that local access line of the first plurality of local access lines and a different respective local access line of the second plurality of local access lines.

4. The memory array structure of claim 1, wherein the first current path is a direct electrical connection between the particular local access line of the first plurality of local access lines and the particular local access line of the second plurality of local access lines, and wherein the second current path is a direct electrical connection between the particular local access line of the first plurality of local access lines and the different local access line of the second plurality of local access lines.

5. A memory array structure, comprising:
    a first block of memory cells including a first plurality of local access lines, wherein each local access line of the first plurality of local access lines is connected to control gates of a respective plurality of memory cells of the first block of memory cells;
a second block of memory cells including a second plurality of local access lines, wherein each local access line of the second plurality of local access lines is connected to control gates of a respective plurality of memory cells of the second block of memory cells;
a plurality of data lines wherein each da line of the plurality of data lines is selectively connected to a memory cell of the respective plurality of memory cells of the first block of memory cells for each access line of the first plurality of access lines, and selectively connected to a memory cell of the respective plurality of memory cells of the second block of memory cells for each access line of the second plurality of access lines; and
a current path as a permanent electrical connection between a particular local access line of the first plurality of local access lines and a particular local access line of the second plurality of local access lines;
wherein the particular local access line of the first plurality of local access lines and the particular local access line of the second plurality of local access lines each have a respective selective connection to a same global access line.

6. The memory array structure of claim 5, wherein the current path is formed between an end of the particular local access line of the first plurality of local access lines that is opposite its selective connection to the global access line, and an end of the particular local access line of the second plurality of local access lines that is opposite its selective connection to the global access line.

7. A memory array structure, comprising:
a first block of memory cells including a first plurality of local access lines, wherein each local access line of the first plurality of local access lines is connected to control gates of a respective plurality of memory cells of the first block of memory cells;
a second block of memory cells including a second plurality of local access lines, wherein each local access line of the second plurality of local access lines is connected to control gates of a respective plurality of memory cells of the second block of memory cells; and
a current path between a particular local access line of the first plurality of local access lines and a particular local access line of the second plurality of local access lines;
wherein the particular local access line of the first plurality of local access lines and the particular local access line of the second plurality of local access lines each have a respective selective connection to a same global access line;
wherein the current path is formed between an end of the particular local access line of the first plurality of local access lines that is opposite its selective connection to the global access line, and an end of the particular local access line of the second plurality of local access lines that is opposite its selective connection to the global access line; and
wherein the particular local access line of the first plurality of local access lines and the particular local access line of the second plurality of local access lines comprise a contiguous conductive plate having an isolation region formed between the selective connection of the particular local access line of the first plurality of local access lines and the selective connection of the particular local access line of the second plurality of local access lines, and extending a majority of a length of the contiguous conductive plate in a direction extending away from the selective connections.

8. A memory array structure, comprising:
a first block of memory cells including a first plurality of local access lines, wherein each local access line of the first plurality of local access lines is connected to control gates of a respective plurality of memory cells of the first block of memory cells;
a second block of memory cells including a second plurality of local access lines, wherein each local access line of the second plurality of local access lines is connected to control gates of a respective plurality of memory cells of the second block of memory cells;
a first current path between a particular local access line of the first plurality of local access lines and a particular local access line of the second plurality of local access lines; and
a second current path between the particular local access line of the second plurality of local access lines and a different local access line of the first plurality of local access lines.

9. The memory array structure of claim 8, wherein the particular local access line of the second plurality of local access lines is immediately adjacent the particular local access line of the first plurality of local access lines.

10. The memory array structure of claim 8, wherein the particular local access line of the first plurality of local access lines and the particular local access line of the second plurality of local access lines each have a respective selective connection to a same global access line.

11. The memory array structure of claim 10, wherein the first current path is formed between an end of the particular local access line of the first plurality of local access lines that is opposite its selective connection to the global access line, and an end of the particular local access line of the second plurality of local access lines that is opposite its selective connection to the global access line.

12. The memory array structure of claim 11, wherein the particular local access line of the first plurality of local access lines and the particular local access line of the second plurality of local access lines comprise a contiguous conductive plate having an isolation region formed between the selective connection of the particular local access line of the first plurality of local access lines and the selective connection of the particular local access line of the second plurality of local access lines, and extending a majority of a length of the contiguous conductive plate in a direction extending away from the selective connections.

13. The memory array structure of claim 8, wherein the particular local access line of the first plurality of local access lines is immediately adjacent the different local access line of the first plurality of local access lines.

14. The memory array structure of claim 13, wherein the memory array structure is a vertical structure, and wherein the particular local access line of the first plurality of local access lines is formed below the different local access line of the first plurality of local access lines.

15. The memory array structure of claim 8, wherein the particular local access line of the first plurality of local access lines and the different local access line of the first plurality of local access lines are each selectively connected to a respective global access line in response to a same control signal.

16. The memory array structure of claim 8, wherein the second current path extends from a first node between a conductive plate forming a portion of the particular local access line of the second plurality of local access lines and a first block select transistor selectively connecting the particular local access line of the second plurality of local access lines to a respective global access line, to a second node between a conductive plate forming a portion of the different local access line of the first plurality of local access lines and a second block select transistor selectively connecting the different local access line of the first plurality of local access lines to a respective global access line.

17. The memory array structure of claim 16, wherein the first node is on the conductive plate forming the portion of the particular local access line of the second plurality of local access lines, and wherein the second node is on the conductive plate forming the portion of the different local access line of the first plurality of local access lines.

18. The memory array structure of claim 8, wherein the memory array structure, for each local access line of the first plurality of local access lines, further comprises:
    a respective first current path between that local access line of the first plurality of local access lines and a respective local access line of the second plurality of local access lines.

19. The memory array structure of claim 8, wherein the memory array structure, for each local access line of a subset of the second plurality of local access lines, further comprises:
    a second current path between that local access line of the second plurality of local access lines and a respective local access line of the first plurality of local access lines.

20. The memory array structure of claim 19, wherein the subset of the second plurality of local access lines comprises all but one local access line of the second plurality of local access lines.

21. A memory, comprising:
    an array of memory cells including a plurality of blocks of memory cells, wherein each block of memory cells of the plurality of blocks of memory cells comprises a respective plurality of local access lines; and
    a controller, wherein the controller is configured to cause the memory to:
        connect each local access line of the respective plurality of local access lines of a selected block of memory cells of the plurality of blocks of memory cells to a respective global access line of a plurality of global access lines;
        connect a selected global access line of the plurality of global access lines to a reference current and to a first input of a comparator, wherein the comparator has a second input connected to receive a reference voltage, and wherein a current path is formed between a respective local access line of the respective plurality of local access lines of the selected block of memory cells for the selected global access line, and a local access line of the respective plurality of local access lines for an unselected block of memory cells of the plurality of blocks of memory cells;
        change a voltage level of the reference voltage until an output of the comparator makes a particular transition while the local access line of the respective plurality of local access lines for the unselected block of memory cells is connected to a voltage node; and
        determine a resistance value of the respective local access line of the respective plurality of local access lines of the selected block of memory for the selected global access line in response to a current level of the reference current and a voltage level of the reference voltage deemed to cause the particular transition of the output of the comparator.

22. The memory of claim 21, wherein the controller being configured to change the voltage level of the reference voltage comprises the controller being configured to increase the voltage level of the reference voltage in a plurality of voltage level step increases.

23. The memory of claim 22, wherein the particular transition of the output of the comparator indicates that the voltage level of the reference voltage transitioned from a voltage level lower than a voltage level of the selected global access line to a voltage level higher than the voltage level of the selected global access line.

24. The memory of claim 22, wherein the voltage level of the reference voltage deemed to cause the particular transition of the output of the comparator is selected from a group consisting of a voltage level of the reference voltage after a last voltage level step increase of the plurality of voltage level step increases, a voltage level of the reference voltage after a different voltage level step increase of the plurality of voltage level step increases immediately prior to the last voltage level step increase, and a voltage level of the reference voltage between the voltage level of the reference voltage after the different voltage level step increase and the voltage level of the reference voltage after the last voltage level step increase.

25. The memory of claim 21, wherein the controller is further configured to connect the local access line of the respective plurality of local access lines for the unselected block of memory cells to the voltage node.

26. The memory of claim 21, wherein the local access line of the respective plurality of local access lines for the unselected block of memory cells is directly connected to the voltage node.

27. A memory, comprising:
    an array of memory cells including a plurality of blocks of memory cells, wherein each block of memory cells of the plurality of blocks of memory cells comprises a respective plurality of local access lines; and
    a controller, wherein the controller is configured to cause the memory to:
        connect each local access line of the respective plurality of local access lines of a selected block of memory cells of the plurality of blocks of memory cells to a respective global access line of a plurality of global access lines;
        connect a selected global access line of the plurality of global access lines to a driver, wherein:
            a first current path is formed between a respective local access line of the respective plurality of local access lines of the selected block of memory cells for the selected global access line, and a local access line of the respective plurality of local access lines for an unselected block of memory cells of the plurality of blocks of memory cells; and
            a second current path is formed between the local access line of the respective plurality of local access lines of the unselected block of memory cells, and a different local access line of the respective plurality of local access lines of the selected block of memory cells; and
        determine a resistance value in response to a current level through the selected global access line and a voltage level of the selected global access line.

28. The memory of claim 27, wherein the resistance value is a first resistance value, and wherein the controller is further configured to cause the memory to:
- connect the local access line of the unselected block of memory cells to a respective global access line;
- determine a second resistance value in response to a second current level through the selected global access line and a second voltage level of the selected global access line; and
- subtract the second resistance value from the first resistance value.

29. The memory of claim 27, wherein the controller being configured to cause the memory to connect each local access line of the respective plurality of local access lines of the selected block of memory cells their respective global access lines of the plurality of global access lines further comprises the controller being configured to isolate each local access line of the respective plurality of local access lines of the unselected block of memory cells from a respective global access line of a plurality of global access lines.

30. The memory of claim 27, wherein the controller being configured to connect the selected global access line to the driver comprises the controller being configured to connect the selected global access line to a driver selected from a group consisting of a voltage driver and a current driver.

31. A memory, comprising:
- an array of memory cells including a plurality of blocks of memory cells, wherein each block of memory cells of the plurality of blocks of memory cells comprises a respective plurality of local access lines; and
- a controller, wherein the controller is configured to cause the memory to:
  - connect each local access line of the respective plurality of local access lines of a selected block of memory cells of the plurality of blocks of memory cells to a respective global access line of a plurality of global access lines;
  - connect a selected global access line of the plurality of global access lines to a reference current and to a first input of a comparator, wherein the comparator has a second input connected to receive a reference voltage, and wherein:
    - a first current path is formed between a respective local access line of the respective plurality of local access lines of the selected block of memory cells for the selected global access line, and a local access line of the respective plurality of local access lines for an unselected block of memory cells of the plurality of blocks of memory cells; and
    - a second current path is formed between the local access line of the respective plurality of local access lines of the unselected block of memory cells, and a different local access line of the respective plurality of local access lines of the selected block of memory cells for a different global access line of the plurality of global access lines; and
  - connect the different global access line to a voltage node;
  - change a voltage level of the reference voltage until an output of the comparator makes a particular transition; and
  - determine a resistance value of the respective local access line of the respective plurality of local access lines of the selected block of memory for the selected global access line in response to a current level of the reference current and a voltage level of the reference voltage deemed to cause the particular transition of the output of the comparator.

32. The memory of claim 31, wherein the controller being configured to change the voltage level of the reference voltage comprises the controller being configured to increase the voltage level of the reference voltage in a plurality of voltage level step increases.

33. The memory of claim 32, wherein the particular transition of the output of the comparator indicates that the voltage level of the reference voltage transitioned from a voltage level lower than a voltage level of the selected global access line to a voltage level higher than the voltage level of the selected global access line.

34. The memory of claim 32, wherein the voltage level of the reference voltage deemed to cause the particular transition of the output of the comparator is selected from a group consisting of a voltage level of the reference voltage after a last voltage level step increase of the plurality of voltage level step increases, a voltage level of the reference voltage after a different voltage level step increase of the plurality of voltage level step increases immediately prior to the last voltage level step increase, and a voltage level of the reference voltage between the voltage level of the reference voltage after the different voltage level step increase and the voltage level of the reference voltage after the last voltage level step increase.

35. The memory of claim 31, wherein the controller being configured to connect the different global access line to the voltage node comprises the controller being configured to connect the different global access line to a voltage node configured to receive a bottom-rail supply voltage.

36. A memory array structure, comprising:
- a first block of memory cells including a first plurality of local access lines, wherein each local access line of the first plurality of local access lines is connected to control gates of a respective plurality of memory cells of the first block of memory cells;
- a second block of memory cells including a second plurality of local access lines, wherein each local access line of the second plurality of local access lines is connected to control gates of a respective plurality of memory cells of the second block of memory cells; and
- a current path between a particular local access line of the first plurality of local access lines and a particular local access line of the second plurality of local access lines;
- wherein the particular local access line of the first plurality of local access lines is selectively connected to a first global access line, and wherein the particular local access line of the second plurality of local access lines is selectively connected to a second global access line different than the first global access line.

* * * * *

UNITED STATES PATENT AND TRADEMARK OFFICE
CERTIFICATE OF CORRECTION

PATENT NO. : 11,557,341 B2
APPLICATION NO. : 17/011018
DATED : January 17, 2023
INVENTOR(S) : Xu et al.

It is certified that error appears in the above-identified patent and that said Letters Patent is hereby corrected as shown below:

In the Claims

Column 20, Claim 1, Line 34, delete "second current path" and insert in place thereof --a second current path--.

Column 20, Claim 1, Line 37, delete "plurality of local access" and insert in place thereof --plurality of local access lines--.

Column 20, Claim 3, Line 51, delete "connection in between" and insert in place thereof --connection between--.

Column 21, Claim 5, Line 8, delete "wherein each da line" and insert in place thereof --wherein each data line--.

Signed and Sealed this
Thirtieth Day of July, 2024

Katherine Kelly Vidal
*Director of the United States Patent and Trademark Office*